(12) United States Patent
Park et al.

(10) Patent No.: US 6,451,635 B2
(45) Date of Patent: Sep. 17, 2002

(54) PHOTOLITHOGRAPHY SYSTEM AND A METHOD FOR FABRICATING A THIN FILM TRANSISTOR ARRAY SUBSTRATE USING THE SAME

(75) Inventors: Woon-Yong Park, Suwon; Jong-Soo Yoon, Cheonan, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/804,056

(22) Filed: Mar. 13, 2001

(30) Foreign Application Priority Data

Mar. 13, 2000 (KR) ........................................ 2000 12486

(51) Int. Cl.[7] .............................................. H01L 29/04
(52) U.S. Cl. ..................... 438/158; 438/151; 349/42; 430/5
(58) Field of Search ................................ 438/158, 151, 438/149; 349/42, 44, 106, 111; 430/5, 312, 7, 322, 324

(56) References Cited

U.S. PATENT DOCUMENTS

| | | | | |
|---|---|---|---|---|
| 4,592,816 A | * | 6/1986 | Emmons et al. | 204/180.6 |
| 5,326,659 A | * | 7/1994 | Liu et al. | 430/5 |
| 5,718,991 A | * | 2/1998 | Lin et al. | 430/5 |
| 5,926,702 A | * | 7/1999 | Kwon et al. | 438/158 |
| 5,945,256 A | * | 8/1999 | Kim et al. | 430/312 |
| 6,057,896 A | * | 5/2000 | Rho et al. | 349/42 |
| 6,151,005 A | * | 11/2000 | Takita et al. | 345/89 |
| 6,243,146 B1 | * | 6/2001 | Rho et al. | 349/42 |
| 6,310,667 B1 | * | 10/2001 | Nakayoshi et al. | 349/42 |

* cited by examiner

*Primary Examiner*—Olik Chaudhuri
*Assistant Examiner*—Laura M Schillinger
(74) *Attorney, Agent, or Firm*—McGuireWoods Hae-Chan Park

(57) ABSTRACT

A method of fabricating a thin film transistor array substrate for a liquid crystal display includes the step of forming a gate line assembly with gate lines, gate electrodes and gate pads. After laying a plurality of layers on the substrate, a photoresist film is deposited onto the layers. The photoresist film is first exposed to light at a first light exposing unit, and secondly exposed to light at a second light exposing unit such that the photoresist film has three portions of different thickness. The photoresist pattern, and some of the underlying layers are etched to form a data line assembly, a semiconductor pattern, and an ohmic contact pattern. The data line assembly includes data lines, source and drain electrodes, and data pads. The remaining photoresist film is removed, and a protective layer is formed on the substrate. The protective layer is etched together with the gate insulating layer to form first to third contact holes exposing the drain electrode, the gate pad and the data pad, respectively. Pixel electrodes, subsidiary gate and data pads are then formed.

25 Claims, 40 Drawing Sheets

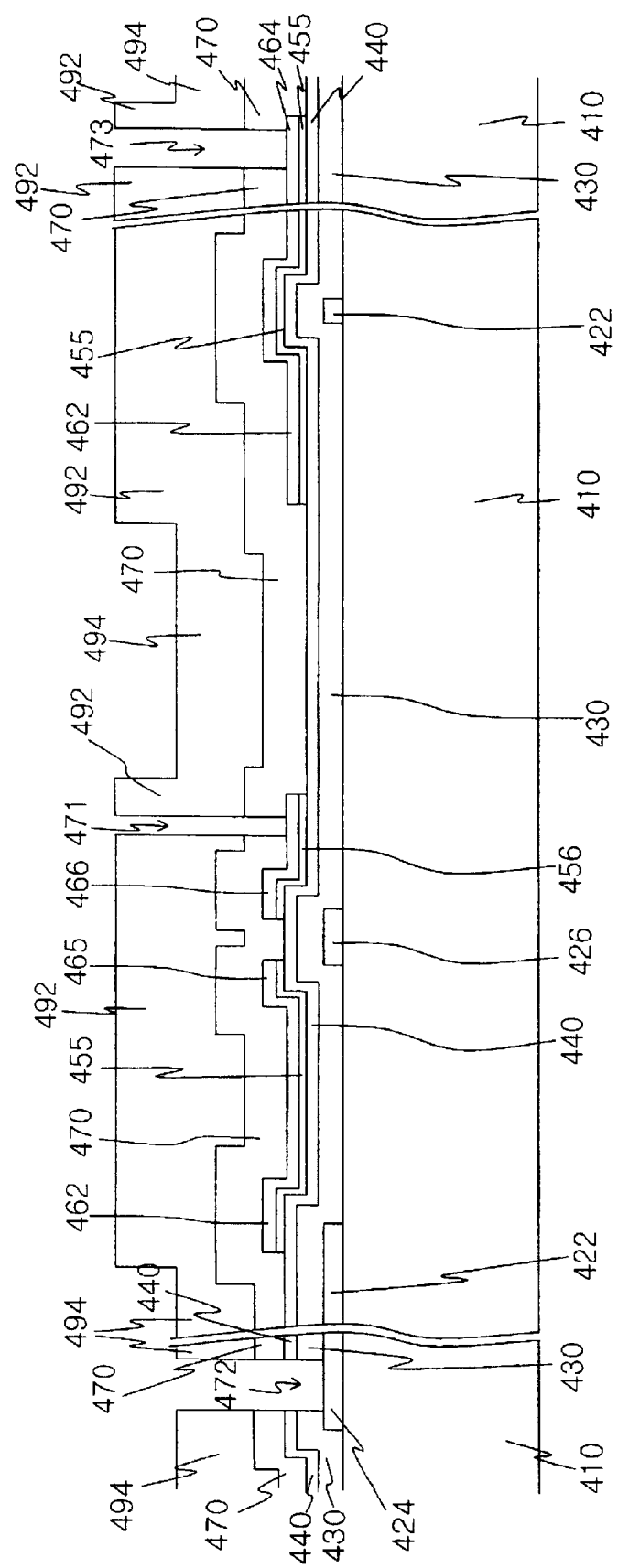

PHOTOLITHOGRAPHY SYSTEM AND A METHOD FOR FABRICATING A THIN FILM TRANSISTOR ARRAY SUBSTRATE USING THE SAME

BACKGROUND OF THE INVENTION (a) Field of the Invention

The present invention relates to a photolithography system, and a method for fabricating a thin film transistor array substrate using the same.

(b) Description of the Related Art

Generally, a semiconductor device is formed through depositing a plurality of thin films onto a substrate, and repeatedly etching the thin films by a photolithography using a photoresist.

In the photolithography process, a photoresist film is first deposited onto the uppermost thin film, and baked through soft baking. Thereafter, the photoresist film is exposed to light using a mask, and selectively removed using a developing solution. The resulting photoresist pattern goes through hard baking, and the underlying thin films are selectively removed using the photoresist pattern as a mask. In this way, the thin film patterns are completed.

In the light exposing process, the shape of masks or the construction of shots may differentiate the amount of light illuminated on the photoresist film. As the light exposing time is longer than the time for depositing or developing the photoresist film, it is required for improving productivity in the photolithography process to effectively control the light exposing process.

Meanwhile, a liquid crystal display has a thin film transistor (TFT) array substrate, a color filter substrate facing the TFT array substrate, and a liquid crystal layer sandwiched between the TFT array substrate and the color filter substrate.

In the TFT array substrate, TFTs and lines are formed on an insulating substrate through depositing thin films on the substrate and repeatedly performing the photolithography process with respect to the thin films. In order to simplify the steps of fabricating such a TFT array substrate, it has been suggested that a minute slit pattern where the slit size is so small as to exceed the decomposing capacity of the light exposure, or a separate film having a different light transmission is formed at the mask, and a photoresist pattern having a portion with a half thickness is formed using such a mask to thereby pattern one or more of the underlying thin films through one photolithography process. However, in such a technique, it is difficult to form uniform patterns over the entire area of a large-sized substrate.

SUMMARY OF THE INVENTION

It is an object of the present invention to provide a photolithography system which enhances productivity in the semiconductor fabrication process.

It is another object of the present invention to provide a method for fabricating a TFT array substrate for a liquid crystal display that bears simplified processing steps.

These and other objects may be achieved by a photolithography system for a semiconductor device, and a TFT array substrate for a liquid crystal display fabricated using the photolithography system.

The photolithography system includes a deposition unit for depositing a photoresist film onto a substrate, first and second light exposing units for exposing the photoresist film to light, and a developing unit for developing the light-exposed photoresist film.

In the method of performing photolithography based on such a photolithography system, a photoresist film is first deposited onto a thin film formed on a substrate. The photoresist film is first exposed to light and, then, secondly exposed to light. Thereafter, the light-exposed photoresist film is developed such that it has at least three portions of different thickness.

The first and second light exposing are performed each with a separate light exposing unit. The intensity of light at the second light exposing is lower than the intensity of light at the first light exposing. The time period for the second light exposing is shorter than the time period for the first light exposing.

According to one aspect of the present invention, in the method of fabricating the TFT array substrate, a gate line assembly is first formed on an insulating substrate. The gate line assembly includes gate lines, and gate electrodes connected to the gate lines. A gate insulating layer, a semiconductor layer, an ohmic contact layer and a conductive layer are sequentially deposited onto the substrate with the gate line assembly. The conductive layer, the ohmic contact layer, and the semiconductor layer are patterned to thereby form a data line assembly, an ohmic contact pattern and a semiconductor pattern. The data line assembly includes data lines, source electrodes connected to the data lines, and drain electrodes separated from the data lines and the source electrodes. A protective layer is formed on the substrate while covering the data line assembly. The protective layer has a contact hole exposing the drain electrode. Pixel electrodes are formed on the substrate such that each pixel electrode is connected to the drain electrode via the contact hole.

The step of forming the data line assembly, the ohmic contact pattern and the semiconductor pattern is performed through photolithography based on a photoresist pattern. The photoresist pattern is made through first exposing a photoresist film to light to form the data line assembly, and secondly exposing the photoresist film to light to form a channel between the source and drain electrodes. The photoresist pattern includes a first portion placed between the source and drain electrodes with a predetermined thickness, a second portion having a thickness larger than the thickness of the first portion, and a third portion having no thickness.

According to another aspect of the present invention, in the method of fabricating the TFT array substrate, a gate line assembly is first formed on an insulating substrate. The gate line assembly includes gate lines, gate electrodes connected to the gate lines, and gate pads connected to the gate lines. A gate insulating layer, a semiconductor layer, an ohmic contact layer and a conductive layer are sequentially deposited onto the substrate with the gate line assembly. The conductive layer, the ohmic contact layer, the semiconductor layer and the gate insulating layer are patterned to thereby form a first contact hole exposing the gate pad, a conductive pattern, an ohmic contact pattern, and a semiconductor pattern. The conductive pattern and the ohmic contact pattern are patterned to thereby complete a data line assembly and ohmic contact patterns. The data line assembly includes data lines, source electrodes connected to the data lines, drain electrodes separated from the data lines and the source electrodes, and data pads connected to one-sided end portions of the data lines. Pixel electrodes are formed on the substrate such that each pixel electrode is connected to the drain electrode. A protective layer is formed on the substrate while covering the data line assembly and the pixel electrodes. The protective layer has second and third contact holes exposing the gate and data pads, respectively.

The step of forming the first contact hole, the ohmic contact pattern and the semiconductor pattern is performed through photolithography based on a photoresist pattern. The photoresist pattern is made through first exposing a photoresist film to light to form the conductive pattern, and secondly exposing the photoresist film to light to form the first contact hole. The photoresist pattern has a first portion placed over the conductive pattern with a predetermined thickness, a second portion placed over the first contact hole with no thickness, and a third portion thinner than the first portion.

According to still another aspect of the present invention, in the method of fabricating the TFT array substrate, a gate line assembly is first formed on an insulating substrate. The gate line assembly includes gate lines, gate electrodes connected to the gate lines, and gate pads connected to the gate lines. A gate insulating layer, a semiconductor layer, and an ohmic contact layer are sequentially deposited onto the substrate with the gate line assembly. The ohmic contact layer, the semiconductor layer and the gate insulating layer are patterned to thereby form a first contact hole exposing the gate pad, an ohmic contact pattern, and a semiconductor pattern. A data line assembly is formed on the ohmic contact pattern. The data line assembly includes data lines, source electrodes connected to the data lines, drain electrodes separated from the data lines and the source electrodes, and data pads connected to one-sided end portions of the data lines. The ohmic contact pattern is completed, and pixel electrodes are formed on the substrate such that each pixel electrode is connected to the drain electrode. A protective layer is formed on the substrate while covering the data line assembly and the pixel electrodes. The protective layer has second and third contact holes exposing the gate and data pads, respectively.

The step of forming the first contact hole, the ohmic contact pattern and the semiconductor pattern is performed through photolithography based on a photoresist pattern. The photoresist pattern is made through first exposing a photoresist film to light to form the ohmic contact pattern, and secondly exposing the photoresist film to light to form the first contact hole. The photoresist pattern has a first portion placed over the ohmic contact pattern with a predetermined thickness, a second portion placed over the first contact hole with no thickness, and a third portion having a thickness smaller than the thickness of the first portion.

According to still another aspect of the present invention, in the method of fabricating the TFT array substrate, a gate line assembly is first formed on an insulating substrate. The gate line assembly includes gate lines, gate electrodes connected to the gate lines, and gate pads connected to the gate lines. A first insulating layer and a semiconductor are sequentially deposited onto the gate line assembly. An ohmic contact pattern is formed on the semiconductor layer. A data line assembly is formed on the ohmic contact pattern. The data line assembly includes data lines, source electrodes connected to the data lines, drain electrodes separated from the data lines and the source electrodes, and data pads connected to one-sided end portions of the data lines. A second insulating layer is formed on the substrate while covering the data line assembly. The second insulating layer, the semiconductor layer, and the first insulating layer are patterned to thereby form a semiconductor pattern and first to third contact holes exposing the drain electrode, the gate pad and the data pad, respectively. Pixel electrodes are formed on the substrate such that each pixel electrode is connected to the drain electrode via the first contact hole.

The step of forming the semiconductor pattern and the first to third contact holes is performed through photolithography based on a photoresist pattern. The photoresist pattern is made through first exposing a photoresist film to light to form the semiconductor pattern, and secondly exposing the photoresist film to light to form the first to third contact holes. The photoresist pattern has a first portion placed over the semiconductor pattern with a predetermined thickness, a second portion placed over the first to third contact holes with no thickness, and a third portion having a thickness smaller than the thickness of the first portion.

According to still another aspect of the present invention, in the method of fabricating the TFT array substrate, a gate line assembly is first formed on an insulating substrate. The gate line assembly includes gate lines, gate electrodes connected to the gate lines, and gate pads connected to the gate lines. A first insulating layer, a semiconductor layer and a second insulating layer are deposited onto the gate line assembly. The second insulating layer, the semiconductor layer and the first insulating layer are patterned to thereby form a second insulating pattern over the gate electrode, and a contact hole exposing the gate pad. An ohmic contact pattern is formed on the second insulating pattern. A data line assembly is formed on the ohmic contact pattern. The data line assembly includes data lines, source electrodes connected to the data lines, drain electrodes separated from the data lines and the source electrodes, and data pads connected to one-sided end portions of the data lines. Pixel electrodes are formed on the substrate such that each pixel electrode is connected to the drain electrode.

The step of forming the second insulating pattern and the contact hole is performed through photolithography based on a photoresist pattern. The photoresist pattern is made through first exposing a photoresist film to light to form the second insulating pattern, and secondly exposing the photoresist film to light to form the contact hole. The photoresist pattern includes a first portion placed over the second insulating pattern with a predetermined thickness, a second portion placed over the contact hole with no thickness, and a third portion thinner than the first portion.

The first and second light exposing are performed each with a separate light exposing unit. The intensity of light at the first light exposing is lower than the intensity of light at the second light exposing. The time interval for the first light exposing is shorter than the time interval for the second light exposing.

The two light exposing units can produce a photoresist pattern of different thickness while making it possible to etch multiple layers once for all, thereby improving productivity and simplifying the processing steps.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or the similar components, wherein:

FIG. 25 is a cross sectional view of the TFT array substrate taken along the XXIVb–XXIVb' line of FIG. 24A illustrating the subsequent processing step to that illustrated in FIG. 24B;

DETAILED DESCRIPTION OF THE PREFERRED EMBODIMENTS

Preferred embodiments of this invention will be explained with reference to the accompanying drawings.

Figure 1:
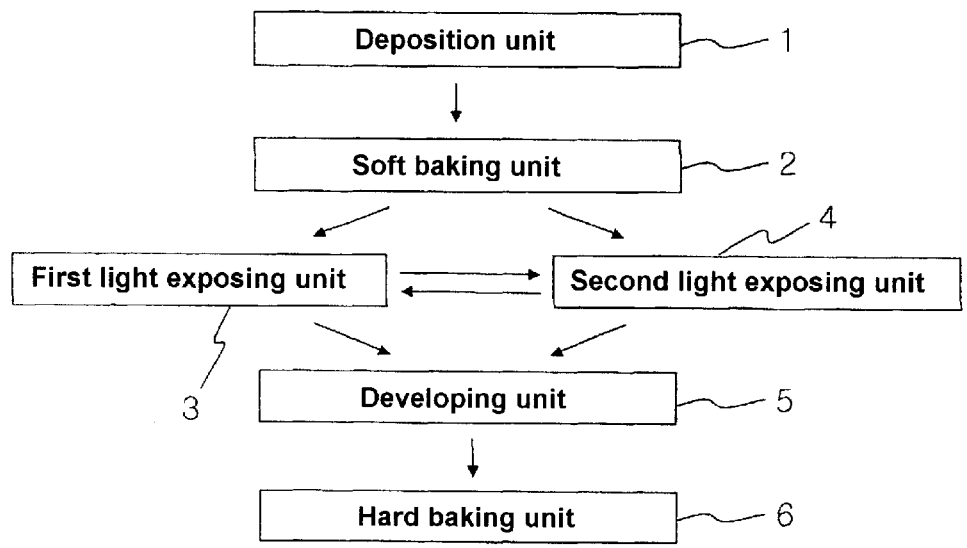
FIG. 1 is a schematic view of a photolithography system according to the present invention.

FIG. 1 illustrates a photolithography system according to the present invention where the flow of process is indicated by an arrow. As shown in FIG. 1, the photolithography system includes a deposition unit 1 for depositing a photoresist film onto a thin film, a soft baking unit 2 for baking the photoresist film to harden it, first and second light exposing units 3 and 4 for illuminating light to the photoresist film through a mask, a developing unit 5 for selectively removing the photoresist film using a developing material to form a photoresist pattern, and a hard baking unit 6 for baking the photoresist pattern to enhance an adhesive strength thereof.

A first photolithography process based on the first light exposing unit 3 and a second photolithography process based on the second light exposing unit 4 are independently performed with respect to the photoresist film to thereby obtain double effects within a predetermined time interval. Alternatively, a photoresist pattern partially differing in thickness may be first formed through exposing the photoresist film to light at the first light exposing unit 3 and again light-exposing it at the second light exposing unit 4. Then, two or more patterns are formed through performing one etching process by using the photoresist pattern as a mask, thereby simplifying the processing steps.

A positive photoresist film is first deposited onto a target thin film using the deposition unit 1. The photoresist film is then baked at the soft baking unit 2, and exposed to light either at the first light exposing unit 3 or at the second light exposing unit 4 through a mask. Thereafter, the exposed portion of the photoresist film is removed at the developing unit 5, and baked at the hard baking unit 6. At this time, the first and second light exposing units 3 and 4 may produce the same light exposing pattern or different patterns. The first photolithography process including the step of light-exposing the photoresist film at the first light exposing unit 3, and the second photolithography process including the step of light-exposing the photoresist film at the second light exposing unit 4 may be performed at the same time, or overlapped, thereby improving productivity.

Alternatively, a positive photoresist film is deposited onto a target thin film using the deposition unit 1, and baked at the soft baking unit 2. Thereafter, the photoresist film is exposed to light sequentially at the first and the second light exposing unit 3 and 4 or in the reverse sequence. The exposed portion of the photoresist film is removed at the developing unit 5, and baked at the hard baking unit 6, thereby producing a photoresist pattern of different thickness depending on the portion. On the basis of such a photoresist pattern, the underlying thin films may be etched to different degrees or multiple layers may be etched once for all.

Of course, a negative photoresist film may be used instead of the positive photoresist film. In this case, the unexposed portion of the photoresist film is removed at the developing process.

The method for forming a photoresist pattern of different thickness using the photolithography system will be described in detail with reference to FIGS. 2A to 2C.

Figure 2A:
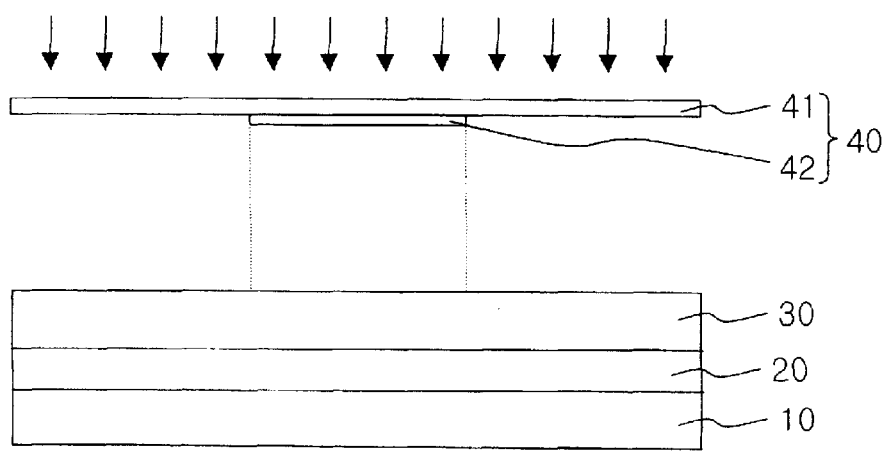
FIGS. 2A to 2C illustrates the techniques of forming a photoresist pattern using the photolithography system shown in FIG. 1.

As shown in FIG. 2A, a thin film 20 is formed on a substrate 10 through chemical vapor deposition, sputtering, or coating, and a positive photoresist film 30 is deposited onto the thin film 20. Thereafter, the positive photoresist film 30 is first exposed to light through a first mask 40 that has a transparent substrate 41 overlaid with a first pattern 42.

Figure 2B:
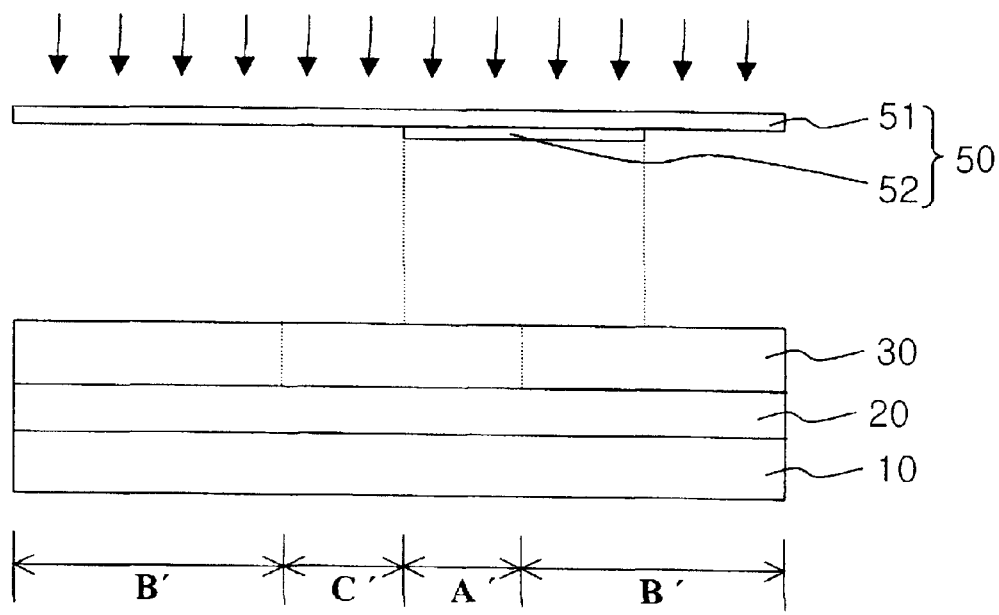

As shown in FIG. 2B, the photoresist film 30 is secondly exposed to light through a second mask 50 such that only the portion C' of the photoresist film 30 among the unexposed portions A' and C' thereof at the first light exposing suffers the second light exposing. The second mask 50 has a transparent substrate 51 overlaid with a second pattern 52. The second pattern 52 may be the same as or different from the first pattern 42 of the first mask 40. In case the patterns 42 and 52 are the same, the second mask 50 is aligned differently from that of the first mask 40. The degree and/or time of light exposure may be the first exposure and for the second exposure.

Figure 2C:
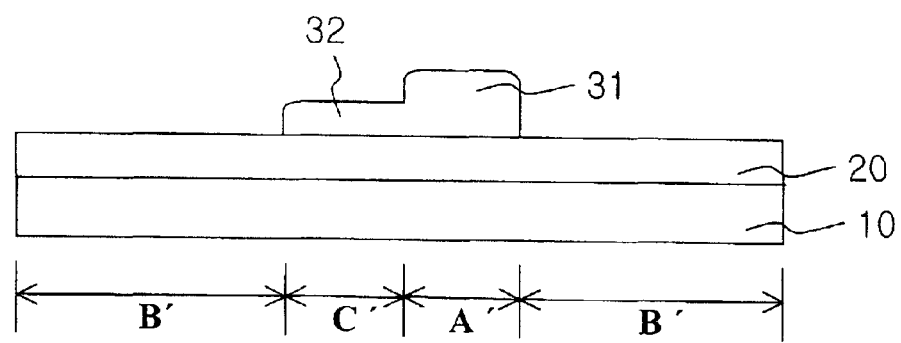

When developed, as shown in FIG. 2C, the portion A' of the resulting photoresist pattern 31 bears a largest thickness, the portion C' thereof bears a thickness smaller than that of the A' portion, and the portion B' thereof is nearly removed.

In this way, the double light exposing process based on the first and second light exposure may produce a photoresist pattern of different thickness.

Figure 3:
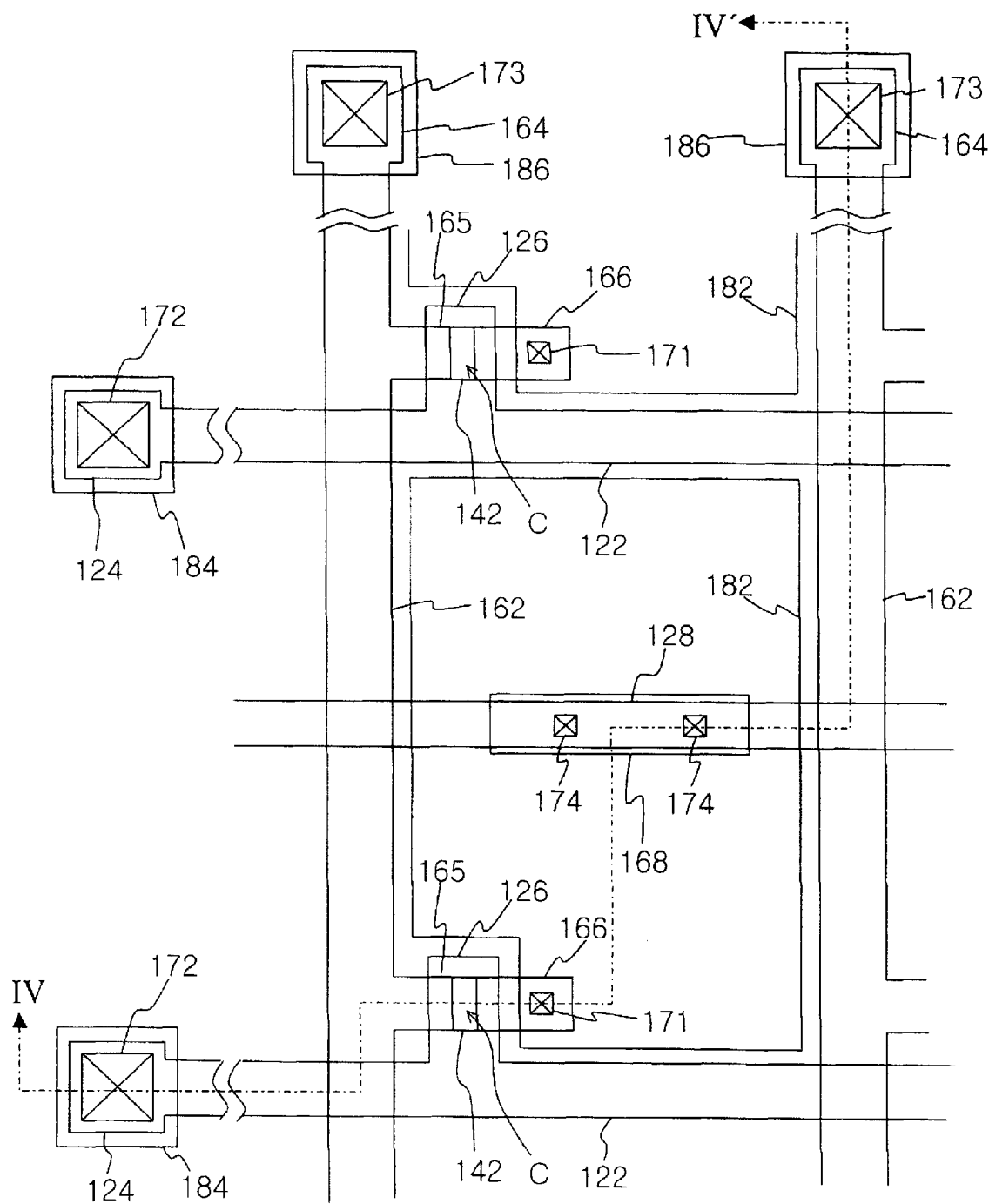
FIG. 3 is a plan view of a TFT array substrate for a liquid crystal display according to a first preferred embodiment of the present invention.
Figure 4:
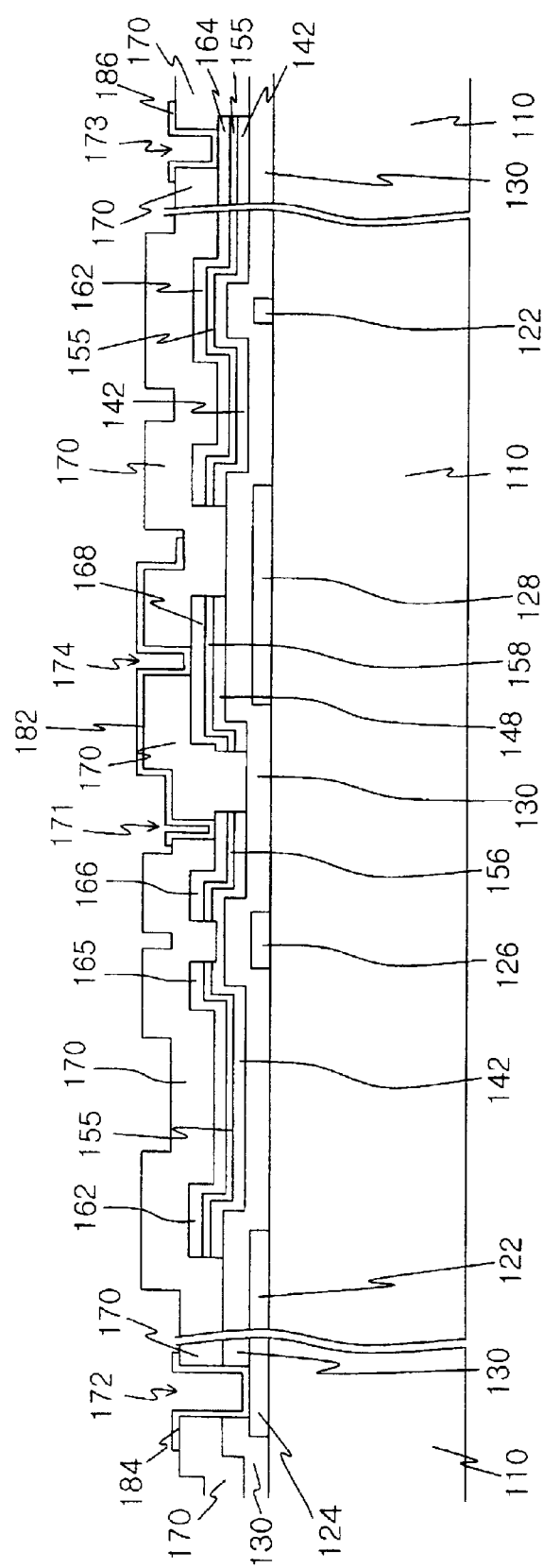
FIG. 4 is a cross sectional view of the TFT array substrate taken along the IV–IV' line of FIG. 3.

FIG. 3 is a plan view of a TFT array substrate for a liquid crystal display according to a first preferred embodiment of the present invention where the formation of TFTs is based on the double light exposing process, and FIG. 4 is a cross sectional view of the TFT array substrate taken along the IV–IV' line of FIG. 3.

As shown in the drawings, a gate line assembly is formed on an insulating substrate 110 with a metallic or conductive material such as aluminum (Al) or aluminum alloy, molybdenum (Mo) or molybdenum-tungsten (MoW) alloy, chrome (Cr), and tantalum (Ta). The gate line assembly includes gate lines 122 proceeding in the horizontal direction, gate pads 124 connected to end portions of the gate lines 122 to receive scanning signals from the outside and transmit them to the gate lines 122, gate electrodes 126 branched from the gate lines 122, and storage capacitor electrodes 128 proceeding parallel to the gate lines 122. The storage capacitor electrodes 128 are overlapped with storage capacitor conductive patterns 168 to thereby form storage capacitors.

The gate line assembly may be structured with a single layer, double layers or triple layers. In case the gate line assembly has a double-layered structure, one layer may be formed with a material of low resistance while the other layer with a material of good contact characteristics with indium tin oxide (ITO) for pixel electrodes such as chrome (Cr), molybdenum (Mo), titanium (Ti), and tantalum (Ta). For instance, such a double-layered structure may be formed with Cr/Al or Al alloy, or Al/Mo.

A gate insulating layer 130 is formed on the gate line assembly with silicon nitride ($SiN_x$) or other materials while covering it.

Semiconductor patterns 142 and 148 are formed on the gate insulating layer 130 with hydrogenated amorphous silicon. Ohmic contact patterns 155, 156 and 158 are formed on the semiconductor patterns 142 and 148 with amorphous silicon into which n-type impurities such as phosphorous (P) are doped at a high density.

A data line assembly is formed on the ohmic contact patterns 155, 156 and 158 with a conductive material such as Mo or MoW alloy, Cr, Al or Al alloy, and Ta. The data line assembly includes data lines 162 proceeding in the vertical direction, data pads 164 connected to one-sided end portions of the data lines 162 to receive picture signals from the outside, and source electrodes 165 branched from the data lines 162. The data line assembly further includes drain electrodes 166 positioned opposite to the source electrodes 165 while centering around the gate electrodes 126 or the channel portions C of the TFTs, and storage capacitor conductive patterns 168 positioned over the storage capacitor electrodes 128. In case the storage capacitor electrodes 128 are absent, the storage capacitor conductive patterns 168 are also omitted.

As is in the gate line assembly, the data line assembly may be structured with a single layer, double layers, or triple layers. In case the data line assembly has a double-layered structure, one layer may be formed with a material of low resistance while the other layer with a good contact characteristic.

The ohmic contact patterns 155, 156 and 158 have the same shape as the data line assembly to lower the contact resistance between the underlying semiconductor patterns 142 and 148 and the overlying data line assembly. That is, the ohmic contact pattern 155 and the overlying data line 162, data pad 164 and source electrode 165, the ohmic contact pattern 156 and the overlying drain electrode 166, and the ohmic contact pattern 158 and the overlying storage capacitor conductive pattern 168 have the same shape, respectively.

In the meantime, the semiconductor patterns 142 and 148 have the same shape as the data line assembly and the ohmic contact patterns 155, 156 and 158 except the channel areas C. That is, the source and drain electrodes 165 and 166 as well as the underlying ohmic contact patterns 155 and 156 are separated from each other, but the semiconductor pattern 142 for the TFT continuously proceeds at the channel area C to thereby form the channel of the TFT.

A protective layer 170 is formed on the data line assembly, and has contact holes 171, 173 and 174 exposing the drain electrode 166, the data pad 164 and the storage capacitor conductive pattern 168, respectively. The protective layer 170 further has a contact hole 172 exposing the gate pad 124 together with the gate insulating layer 130. The protective layer 170 may be formed with an organic insulating material such as silicon nitride or an acryl-based material.

Pixel electrodes 182 are formed on the protective layer 170 to receive picture signals from the TFTs and generate electric fields together with a common electrode of the color filter substrate (not shown). The pixel electrodes 182 are formed with a transparent conductive material such as ITO. Each pixel electrode 182 is connected to the drain electrode 166 through the contact hole 171. Furthermore, the pixel electrode 182 is connected to the storage capacitor conductive pattern 168 through the contact hole 174 to transmit picture signals to the conductive pattern 168.

A subsidiary gate pad 184 and a subsidiary data pad 186 are formed on the gate and data pads 124 and 164 while being connected thereto through the contact holes 172 and 173, respectively. The subsidiary gate and data pads 184 and 186 are provided to enhance adhesion between the gate and data pads 124 and 164 and external circuits while protecting the gate and data pads 124 and 164, but can be omitted.

In reflection-type liquid crystal displays, an opaque conductive material may be used for the pixel electrode 182 instead of ITO.

FIGS. 5A to 10B sequentially illustrate the steps of fabricating the TFT array substrate shown in FIG. 3.

Figure 5A:
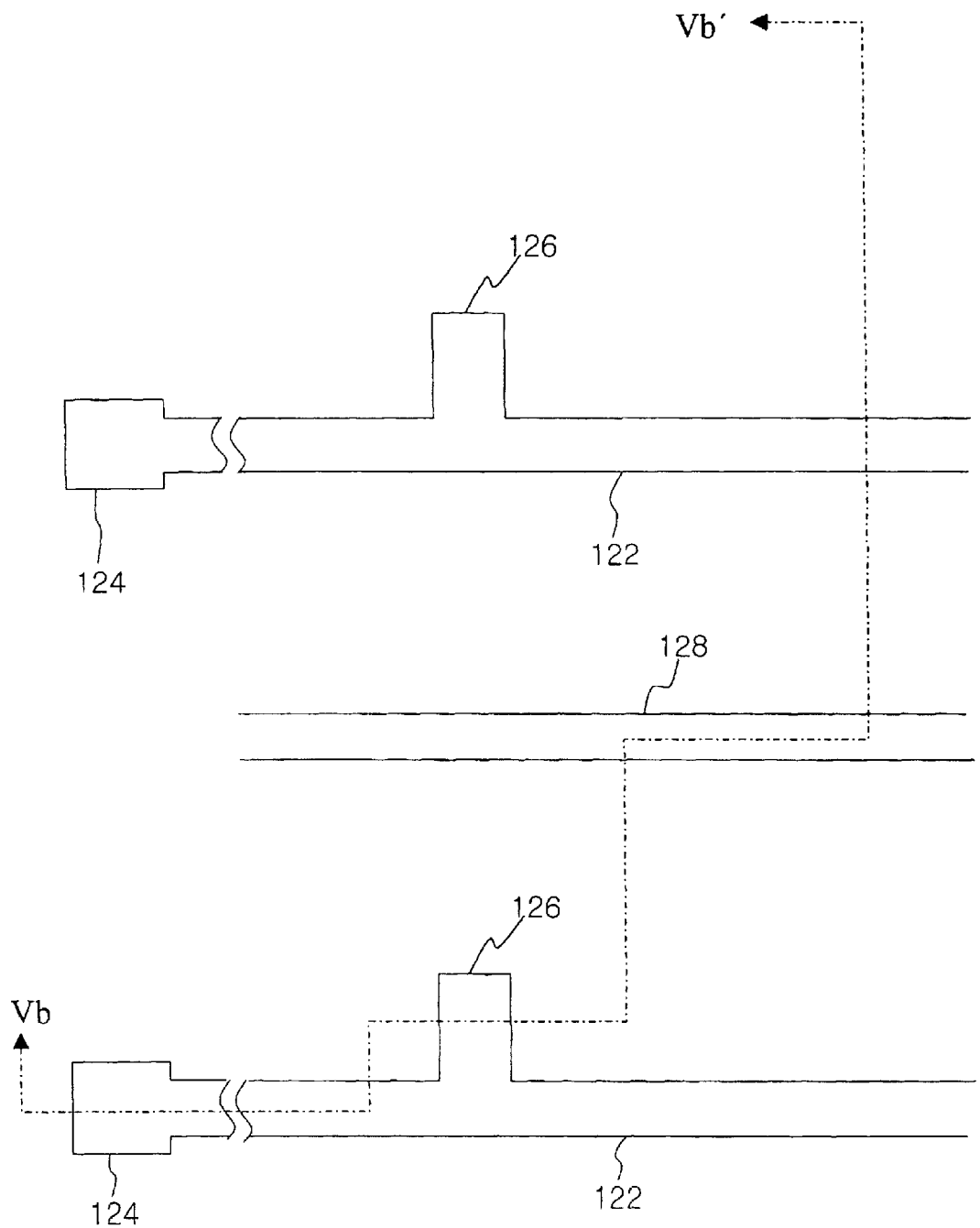
FIG. 5A is a plan view of the TFT array substrate shown in FIG. 3 illustrating the first step of processing the same.
Figure 5B:
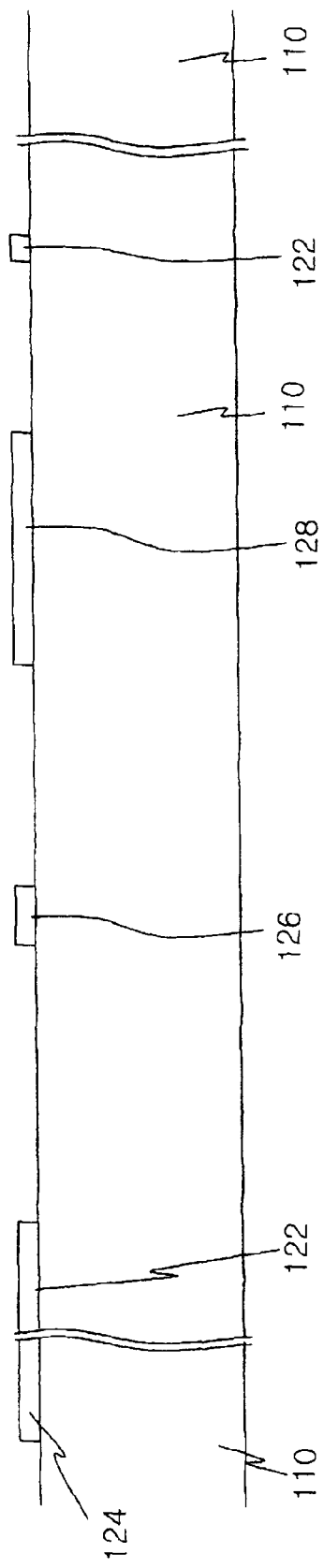
FIG. 5B is a cross sectional view of the TFT array substrate taken along the Vb–Vb' line of FIG. 5A.

As shown in FIGS. 5A and 5B, a metallic conductive layer is deposited onto a substrate 110 to a thickness of 1000 to 3000 Å, and goes through a first photolithography process to form a gate line assembly. The gate line assembly includes gate lines 122, gate pads 124, gate electrodes 126, and storage capacitor electrodes 128.

Figure 6A:
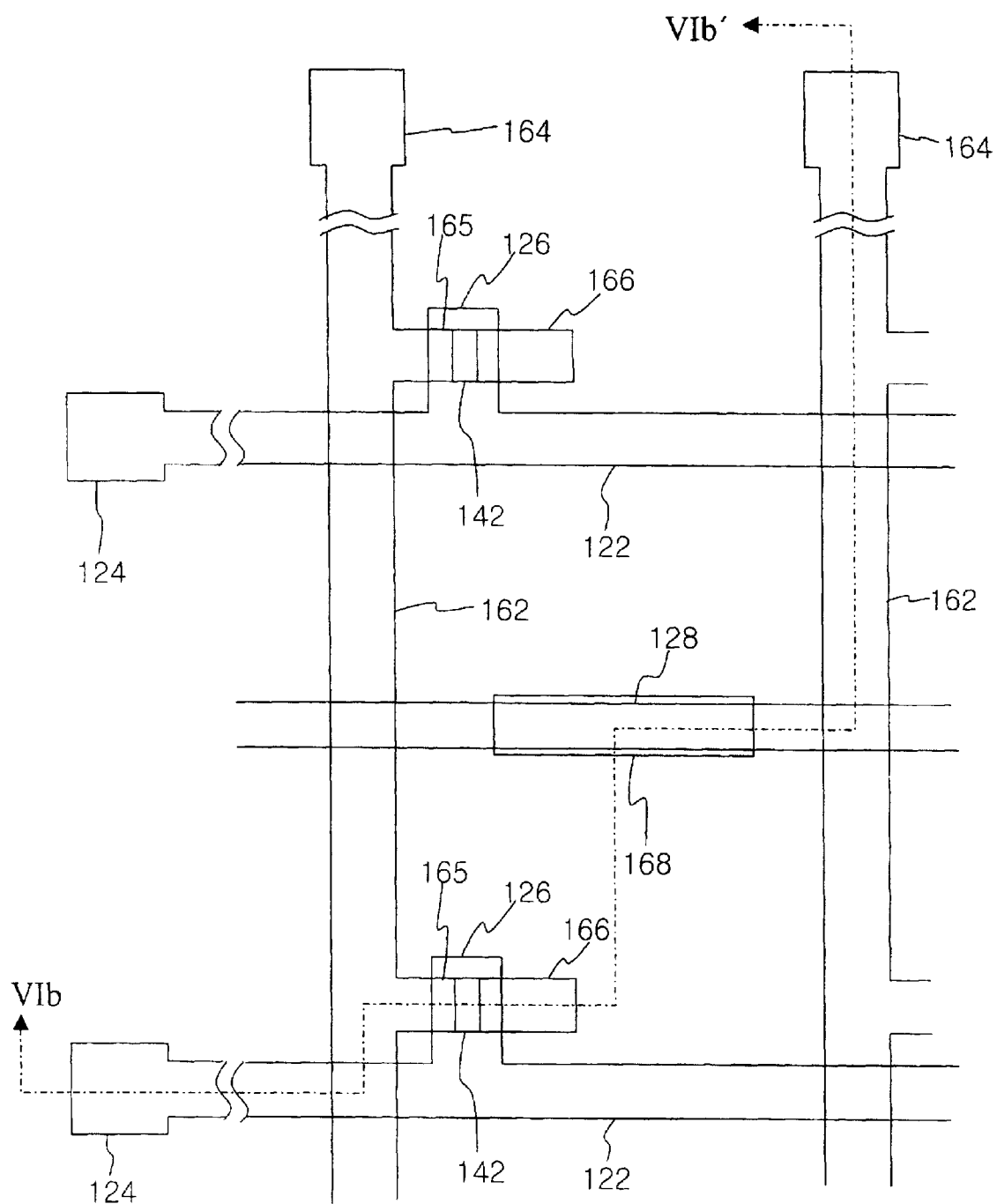
FIG. 6A is a plan view of the TFT array substrate shown in FIG. 3 illustrating the subsequent processing step to that illustrated in FIG. 5B.
Figure 6B:
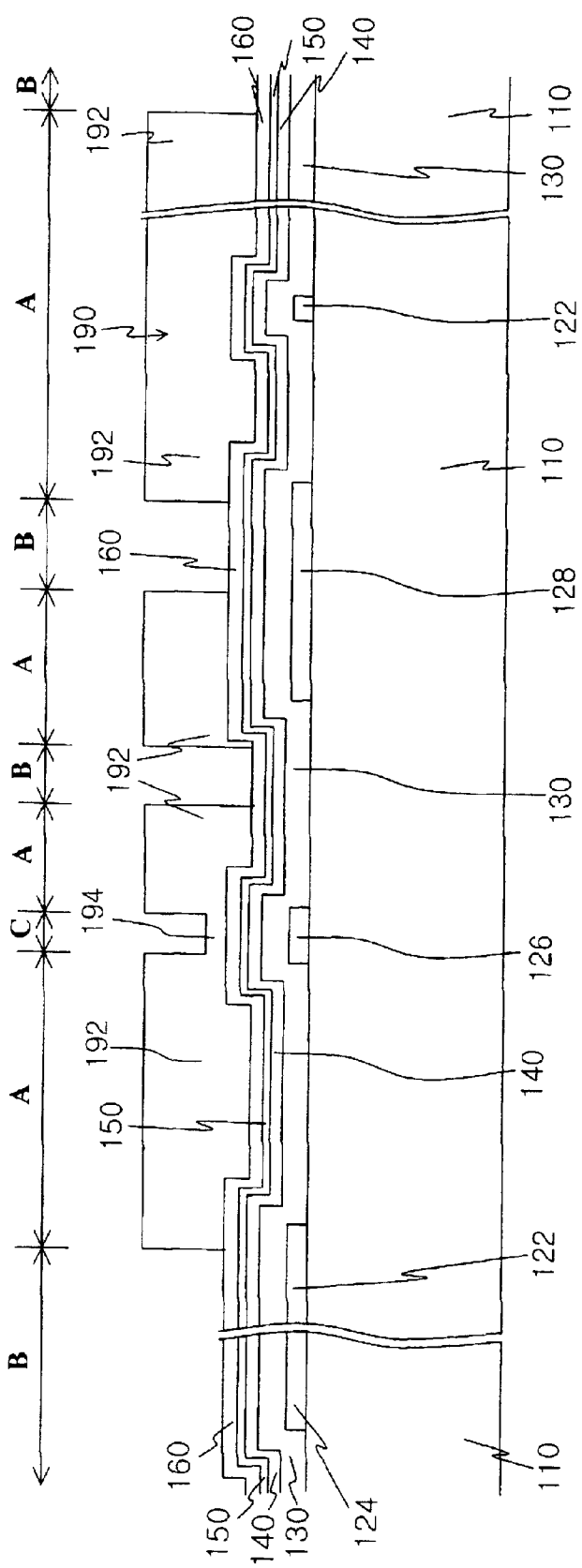
FIG. 6B is a cross sectional view of the TFT array substrate taken along the VIb–VIb' line of FIG. 6A.

Thereafter, as shown in FIGS. 6A and 6B, a gate insulating layer 130, a semiconductor layer 140 and an ohmic contact layer 150 are sequentially deposited onto the substrate 110 with the gate line assembly through chemical vapor deposition. The thickness of the gate insulating layer 130 is in the range of 1500–5000 Å, the thickness of the semiconductor layer 140 in the range of 500–2000 Å, and the thickness of the ohmic contact layer 150 in the range of 300–600 Å. Thereafter, a metallic conductive layer 160 is deposited onto the ohmic contact layer 150 to a thickness of 1500 to 3000 Å through sputtering, and a photoresist film 190 is deposited onto the conductive layer 160. The photoresist film 190 is exposed to light through the aforementioned double light exposing process such that the photoresist film 190 has a first portion 192 at the data line assembly area A having a predetermined thickness, a second portion 194 at the channel area C thinner than the first portion 192, and a third portion at the remaining area B having no thickness. The thickness of the second portion 194 of the photoresist film 190 is established to be ¼ or less than that of the first portion 192. The thickness of the first portion 192 of the photoresist film 190 is preferably in the range of 1.6–1.9 μm, and the thickness of the second portion 194 of the photoresist film 190 in the range of 4000Å or less, more preferably about 3000Å.

Thereafter, the photoresist film 190, and the underlying conductive layer 160, ohmic contact layer 150 and semiconductor layer 140 are etched together such that the data line assembly components and the underlying layers are all left at the data line assembly area A, only the semiconductor layer 140 is left at the channel area C, and the conductive layer 160, the ohmic contact layer 150 and the semiconductor layer 140 are all removed at the remaining area B while exposing the gate insulating layer 130.

Figure 7:
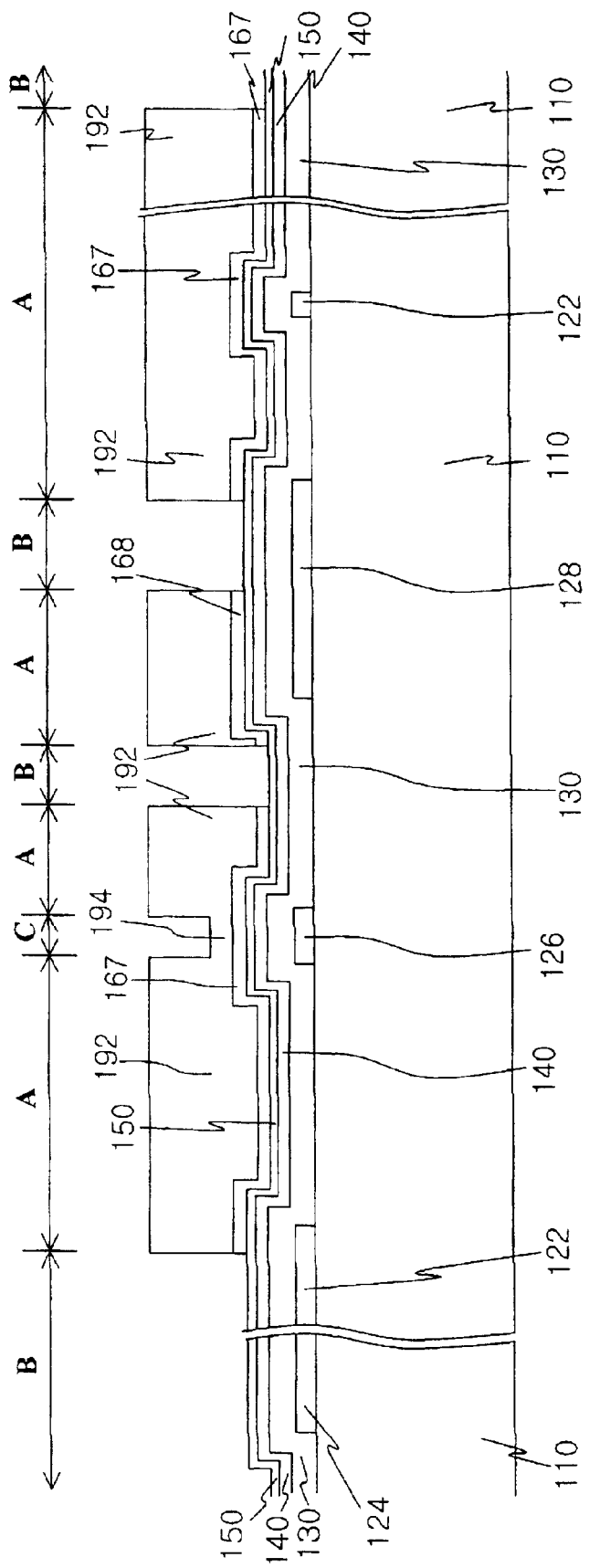
FIG. 7 is a cross sectional view of the TFT array substrate taken along the VIb–VIb' line of FIG. 6A illustrating the subsequent processing step to that illustrated in FIG. 6B.

Specifically, as shown in FIG. 7, the exposed conductive layer 160 at the B area is removed while exposing the underlying ohmic contact layer 150. In this processing step, either dry etching or wet etching can be selectively used in condition that the conductive layer 160 is etched without etching the first and second portions 192 and 194 of the photoresist film 190. However, in the case of dry etching, since it is difficult to find such a condition, the first and second portions 192 and 194 of the photoresist film 190 should be etched together. In this case, the second portion 194 of the photoresist film 190 should be much thicker than in wet etching to prevent the conductive layer 160 under the second portion 194 from being exposed.

If the conductive layer 160 is formed of Mo or MoW alloy, Al or Al alloy, or Ta, either dry etching or wet etching can be used. However, in case the conductive layer 160 is formed of Cr, the wet etching method is preferable because Cr is not well removed through the dry etching. When the wet etching is used for etching the Cr-based conductive layer 160, $CeNHO_3$ may be used for the etching solution. When the dry etching is used for etching the Mo or MoW-based conductive layer 160, a mixture of $CF_4$ and HCl or a mixture of $CF_4$ and $O_2$ may be used for the etching gas.

In this way, as shown in FIG. 7, the portions of the conductive layer 160 at the channel area C and the data line assembly area A, that is, the conductive pattern 167 for the TFT and the conductive pattern 168 for the storage capacitor are left, and the portion of the conductive layer 160 at the B area is removed while exposing the underlying ohmic contact layer 150. The remaining conductive patterns 167 and 168 have the same shape as the data line assembly except that the conductive pattern 167 for the TFT proceeds continuously without separation. In the case of the dry etching, the first and second portions 192 and 194 of the photoresist film 190 are also etched at a predetermined degree.

Figure 8:
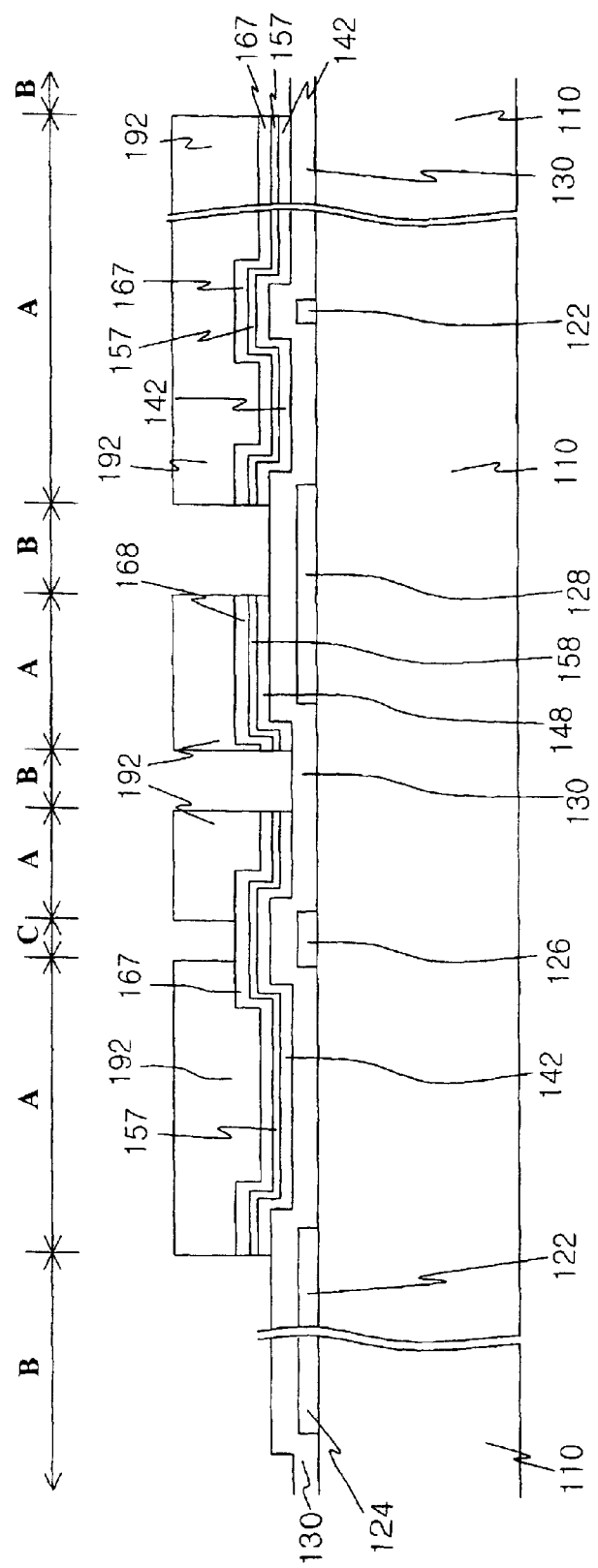
FIG. 8 is a cross sectional view of the TFT array substrate taken along the VIb–VIb' line of FIG. 6A illustrating the subsequent processing step to that illustrated in FIG. 7.

Thereafter, as shown in FIG. 8, the exposed ohmic contact layer 150 and the underlying semiconductor layer 140 at the B area are removed together with the second portion 194 of the photoresist film through dry etching. At this time, the first and second portions 192 and 194 of the photoresist film 190, the ohmic contact layer 150 and the underlying semiconductor layer 140 should be etched at the same time, but the gate insulating layer 130 should not be etched. It is preferable that the etching ratios of the first and second portions 192 and 194 of the photoresist film 190 and the semiconductor layer 140 are the same. For instance, if the mixture of $SF_6$ and HCl or the mixture of $SF_6$ and $O_2$ is used as etching gas, the relevant portions can be etched nearly with the same thickness. When the etching ratios are the same, the second portion 194 of the photoresist film 190 should have the same thickness as the sum of the semiconductor layer 140 and the ohmic contact layer 150, or smaller than the sum.

In this way, as shown in FIG. 8, the second portion 194 of the photoresist film 190 at the channel area C is removed while exposing the conductive pattern 167 for the TFT. The ohmic contact layer 150 and the underlying semiconductor layer 140 at the B area are removed while exposing the underlying gate insulating layer 130. The first portion 192 of the photoresist film 190 at the data line assembly area A is also etched, reducing its thickness. In this process, the semiconductor patterns 142 and 148 are completed. In the drawing, the ohmic contact pattern under the conductive pattern 167 for the TFT is indicated by the reference numeral 157, and the ohmic contact pattern under the conductive pattern 168 for the storage capacitor by the reference numeral 158.

Thereafter, the residue of the photoresist film 190 on the conductive pattern 167 for the TFT at the channel area C is removed through ashing. Plasma gas or microwave is used for the ashing, and oxygen is mainly used for asking.

Figure 9:
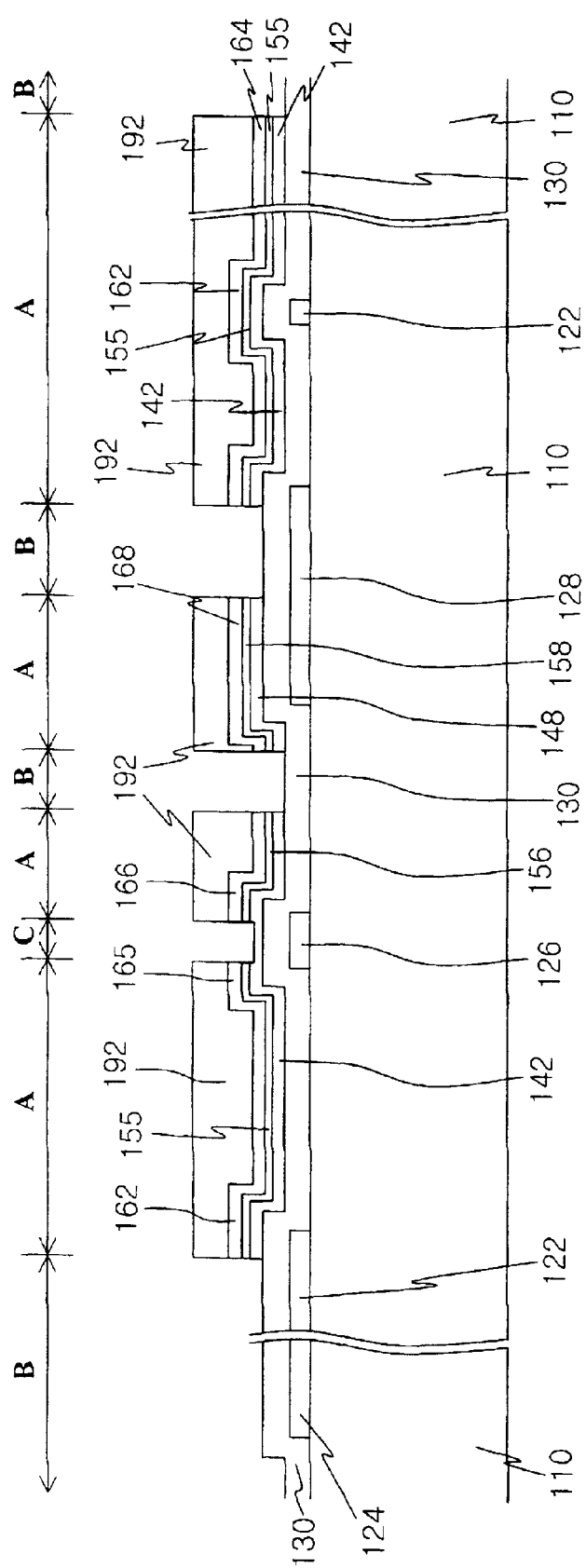
FIG. 9 is a cross sectional view of the TFT array substrate taken along the VIb–VIb' line of FIG. 6A illustrating the subsequent processing step to that illustrated in FIG. 8.

Thereafter, as shown in FIG. 9, the conductive pattern 167 for the TFT and the underlying ohmic contact pattern 157 at the channel area C are removed through etching. At this time, dry etching may be used for removing the conductive pattern 167 and the ohmic contact pattern 157. Alternatively, wet etching is used for removing the conductive pattern 167 while dry etching for removing the ohmic contact pattern 157. In the former case, the conductive pattern 167 and the ohmic contact pattern 157 preferably bear relatively great etching selection ratios because it is difficult with low etching selection ratios to find the final point of etching and control the thickness of the semiconductor pattern 142 remaining at the channel area C. At this time, the semiconductor pattern 142 may be partially etched together with the first portion 192 of the photoresist film 190, whereas the gate insulating layer 130 should not be etched. The photoresist film 190 should be thick enough so as not to expose, the underlying data line assembly when the first portion 192 of the photoresist film 190 is etched.

In this way, the source electrode 165 and the drain electrode 166 are separated from each other, and the data line assembly and the underlying ohmic contact patterns 155, 156 and 158 are completed.

Finally, the first portion 192 of the photoresist film 190 remaining at the data line assembly area A is removed.

In case the data line assembly is formed of a material that can be etched by dry etching, the thickness of the photoresit film is controlled such that the ohmic contact patterns, semiconductor patterns and the data line assembly can be formed through only one etching process without intermediate processing steps. That is, the conductive layer 160, the ohmic contact layer 150 and the semiconductor layer 140 at the B area may be etched while etching the second portion 194 of the photoresist film 190 at the C area and the underlying conductive layer 160 and ohmic contact layer 150, and partially etching the first portion 192 of the photoresist film 190 at the A area.

Figure 10A:
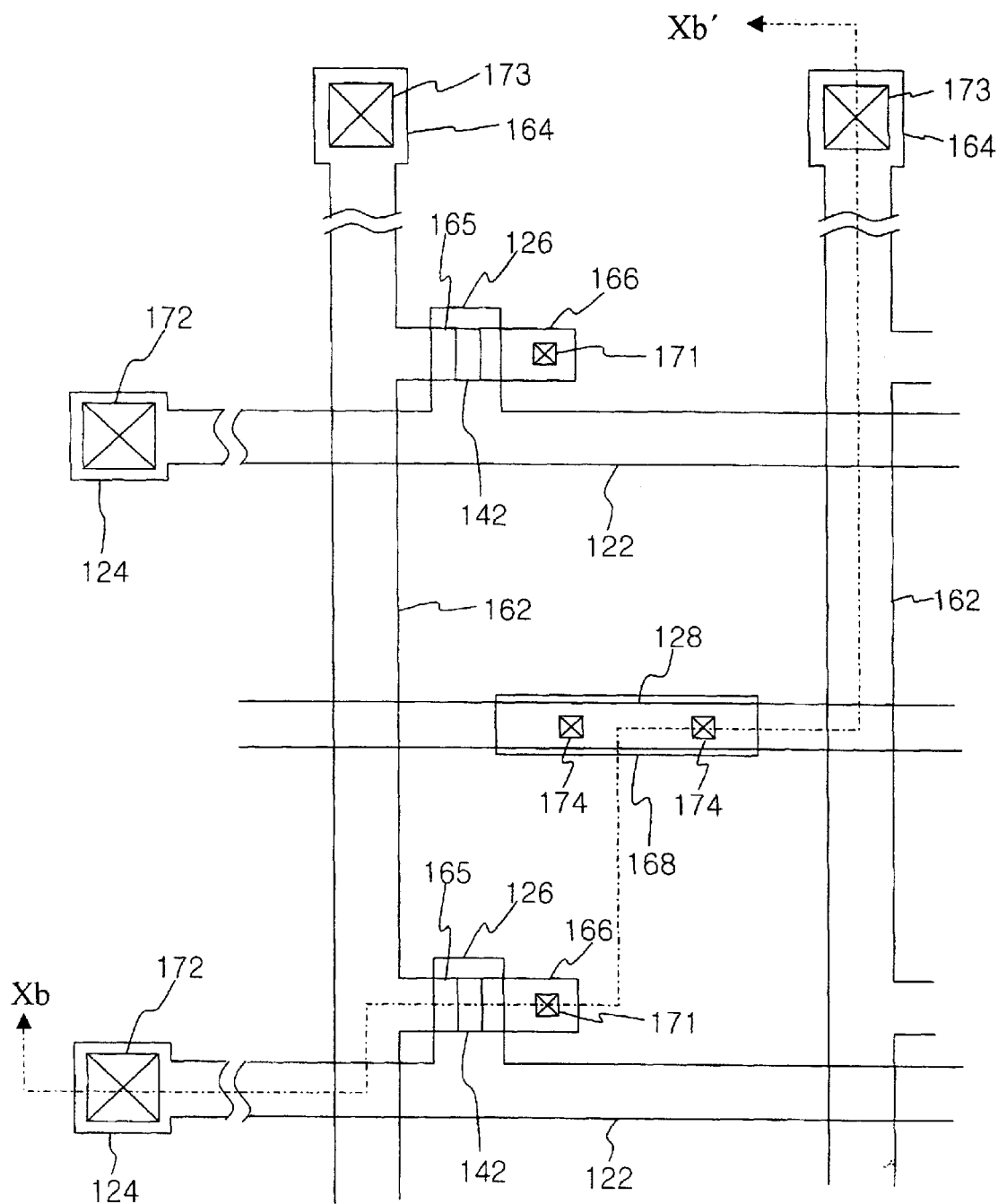
FIG. 10A is a plan view of the TFT array substrate shown in FIG. 3 illustrating the subsequent processing step to that illustrate in FIG. 9.
Figure 10B:
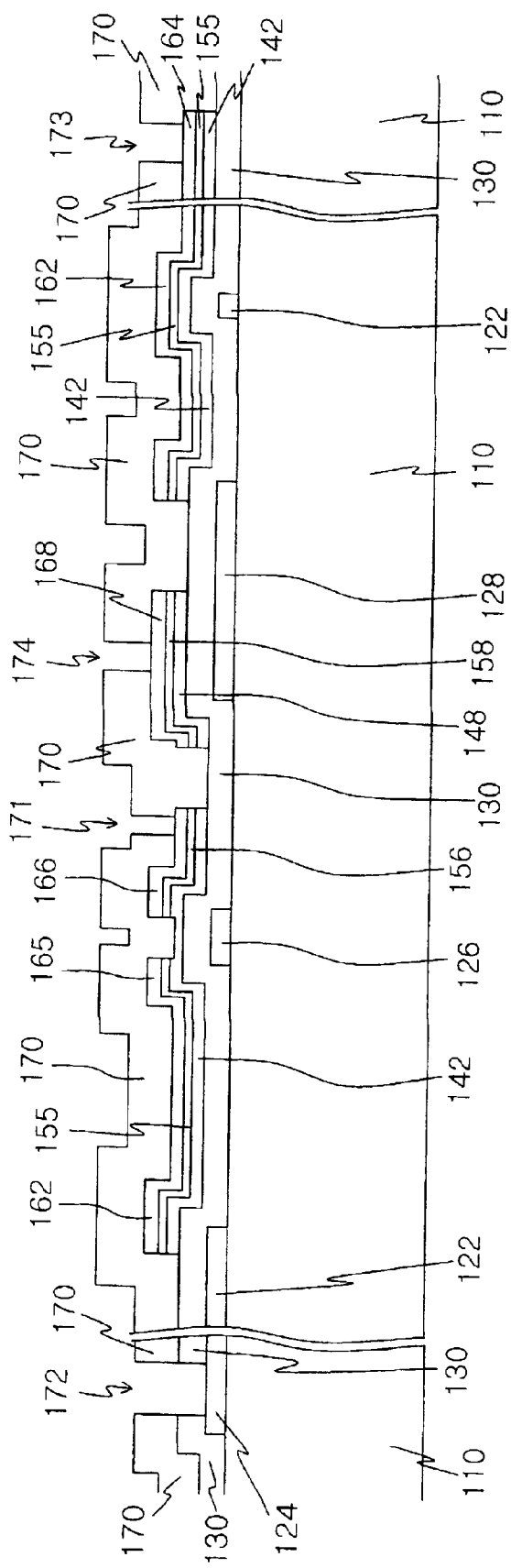
FIG. 10B is a cross sectional view of the TFT array substrate taken along the Xb–Xb' line of FIG. 10A.

After the data line assembly is formed, as shown in FIGS. 10A and 10B, silicon nitride is deposited onto the substrate 110, or an organic insulating material is spin-coated onto the substrate 110 to thereby form a protective layer 170 with a thickness of 2000☐ or more. Thereafter, the protective layer 170 is etched together with the gate insulating layer 130 through a third photolithography process to thereby form contact holes 171 to 174 exposing the drain electrode 166, the gate pad 124, the data pad 164 and the storage capacitor conductive pattern 168, respectively.

Finally, as shown in FIGS. 3 and 4, an ITO-based layer with a thickness of 400 to 500☐ is deposited onto the substrate 110, and etched through a fourth photolithography process to thereby form pixel electrodes 182, subsidiary gate pads 184, and subsidiary data pads 186.

As described above, in the method of fabricating a TFT array substrate according to the first preferred embodiment, for the purpose of etching several layers all at once, the double light exposing process is used while forming a photoresist film 190 of different thickness at three portions. On the basis of such a photoresist film 190, the data line assembly, and the underlying ohmic contact patterns 155, 156 and 158, and semiconductor patterns 142 and 148 can be formed in a simplified manner.

Figure 11:
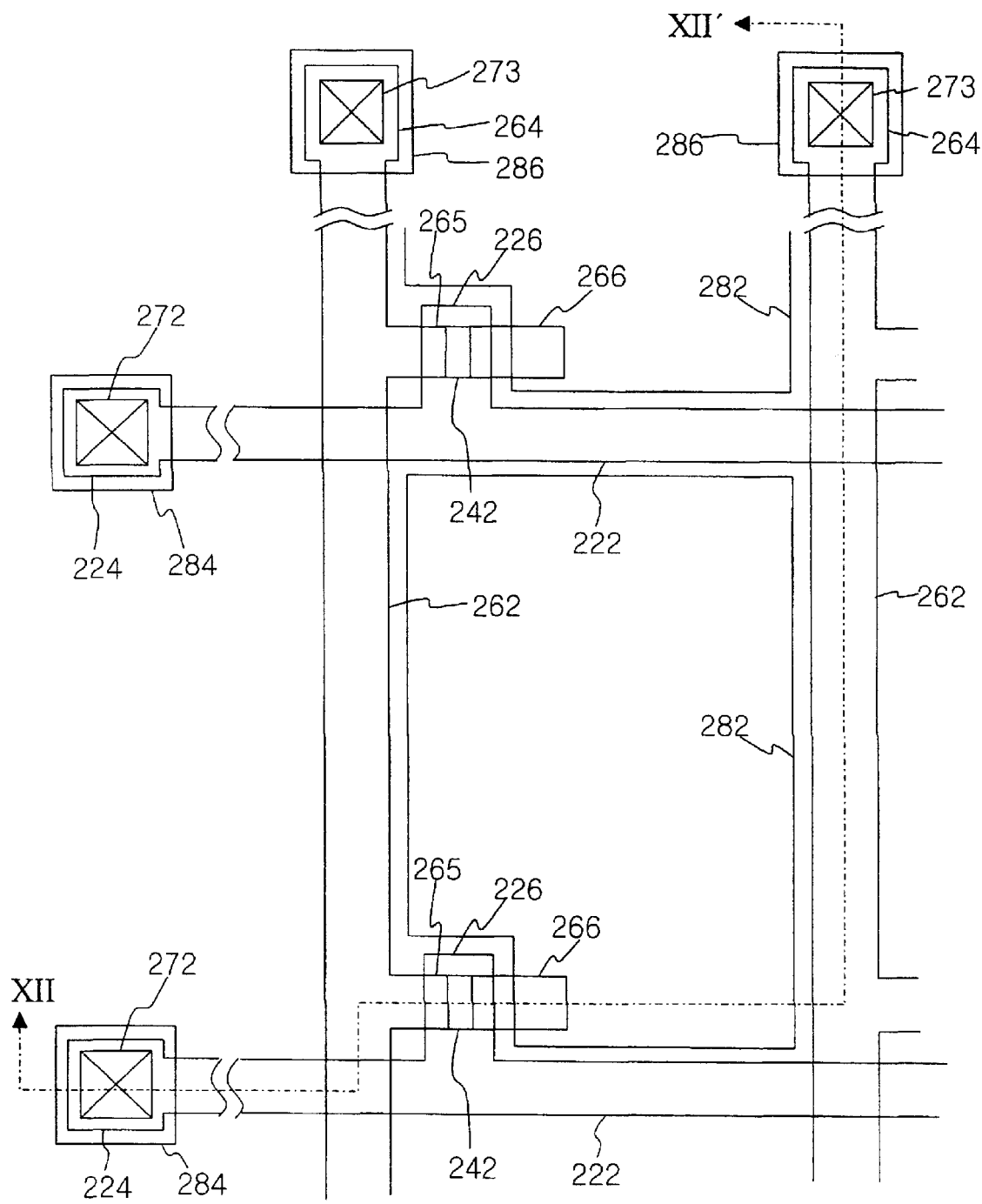
FIG. 11 is a plan view of a TFT array substrate for a liquid crystal display according to a second preferred embodiment of the present invention.
Figure 12:
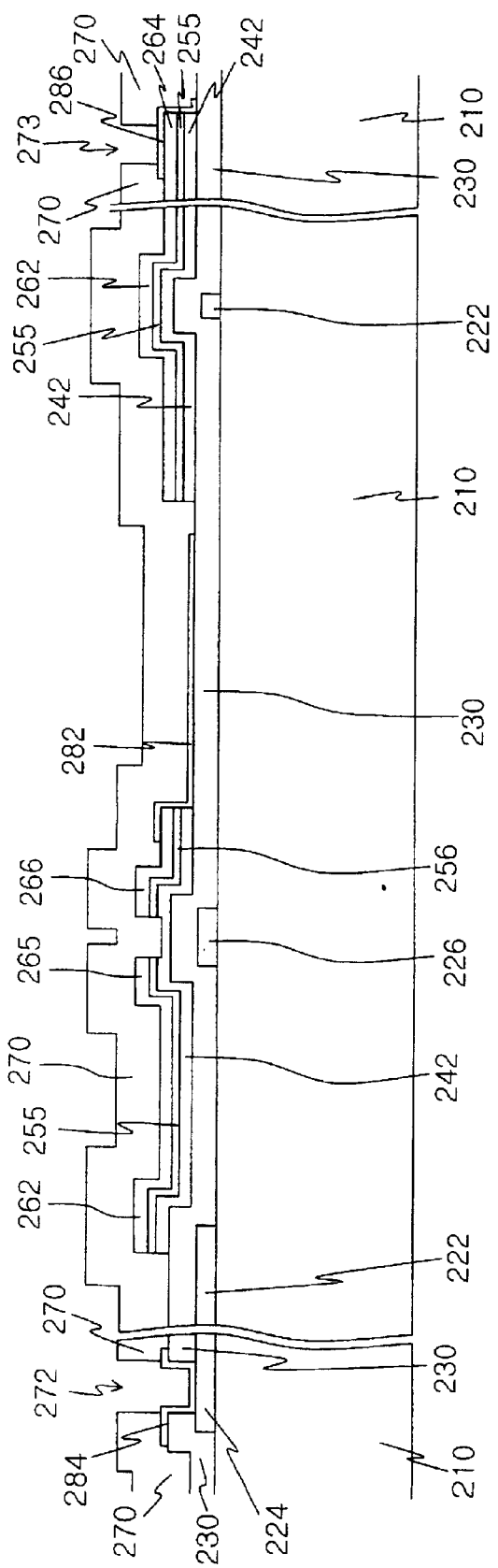
FIG. 12 is a cross sectional view of the TFT array substrate taken along the XII–XII' line of FIG. 11.

FIG. 11 is a plan view of a TFT array substrate for a liquid crystal display according to a second preferred embodiment of the present invention, and FIG. 12 is a cross sectional view of the TFT array substrate taken along the XII–XII' line of FIG. 11. In this preferred embodiment, other components and structures of the TFT array substrate are the same as those related to the first preferred embodiment except that pixel electrodes 282 and subsidiary gate and data pads 284 and 286 are formed under a protective layer 270, and the storage capacitor electrode 128, the storage capacitor conductive pattern 128, the semiconductor pattern 148 and the ohmic contact pattern 158 are omitted.

As is in the previous preferred embodiment, a gate line assembly is first formed on an insulating substrate 210. The gate line assembly includes gate lines 222, gate pads 224, and gate electrodes 226.

Figure 13A:
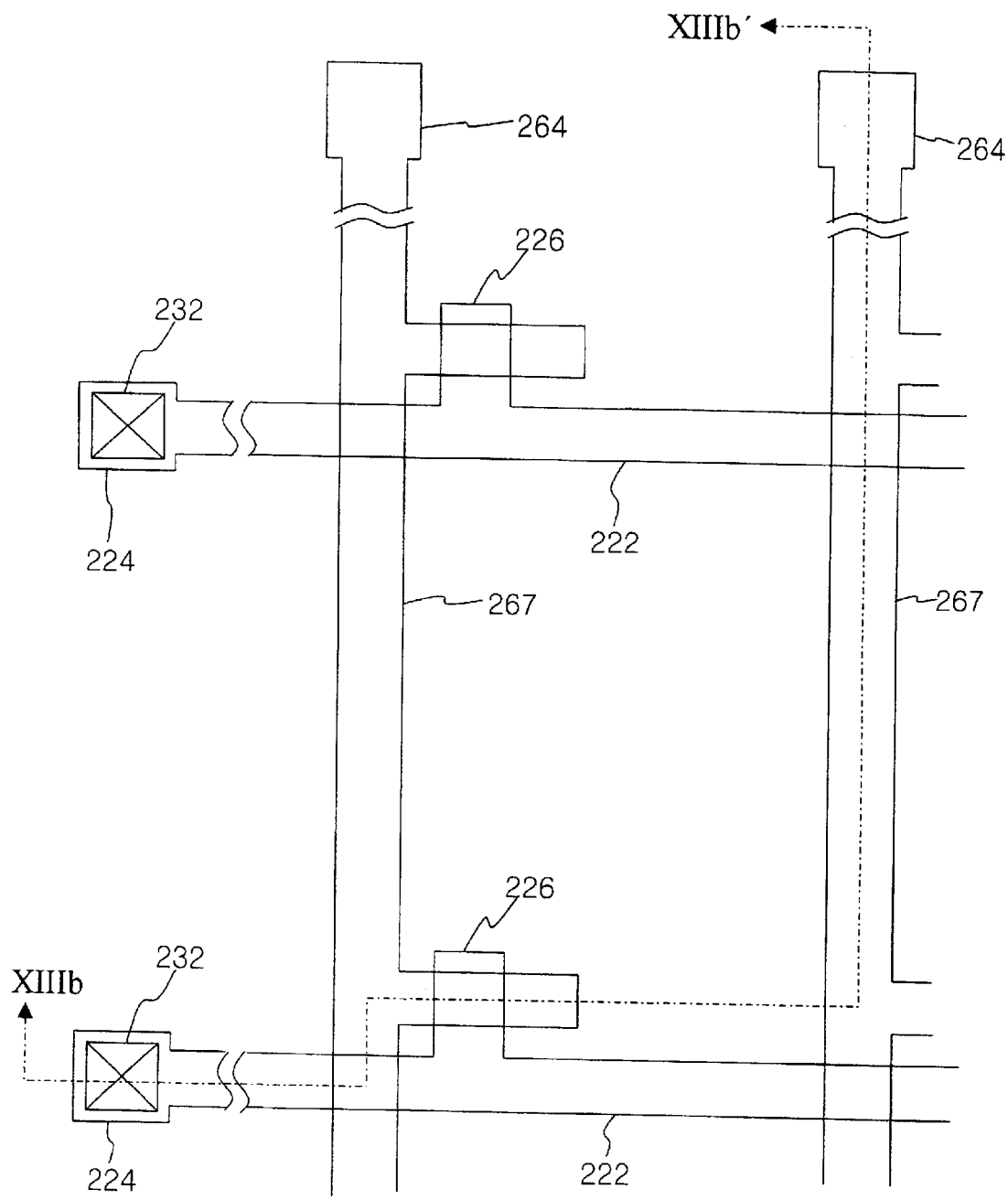
FIG. 13A is a plan view of the TFT array substrate shown in FIG. 11 illustrating the first step of processing the same.
Figure 13B:
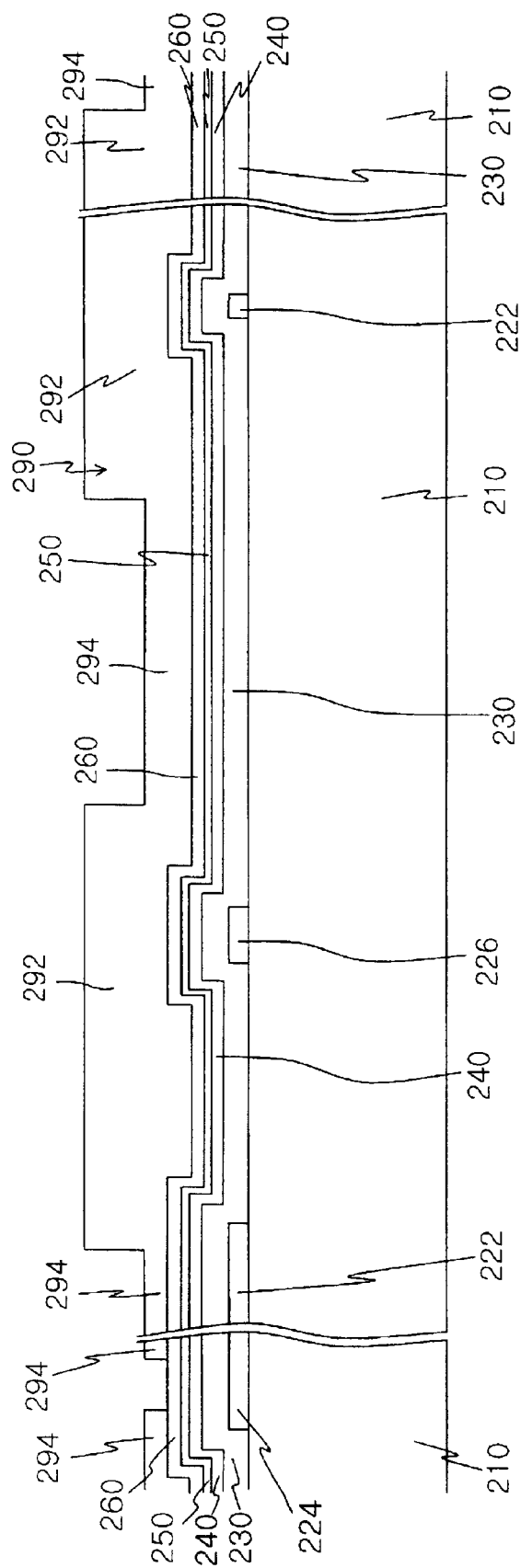
FIG. 13B is a cross sectional view of the TFT array substrate taken along the XIIIb–XIIIb' line of FIG. 13A.

Thereafter, as shown in FIGS. 13A and 13B, a gate insulating layer 230, a semiconductor layer 240, an ohmic contact layer 250, and a conductive layer 260 are sequentially deposited onto the substrate 210 with the gate line assembly. A photoresist film 290 is deposited onto the conductive layer 260, and goes through the aforementioned double light exposing process such that it has first and second portions 292 and 294 of different thickness. The first portion 292 of the photoresist film 290 with a predetermined thickness is to form the data line assembly, the second portion 294 of the photoresist film 290 is thinner than the first portion 292. The remaining portion of the photoresist film 290 with no thickness is to form a contact hole 232 over the gate pad 224.

Figure 14:
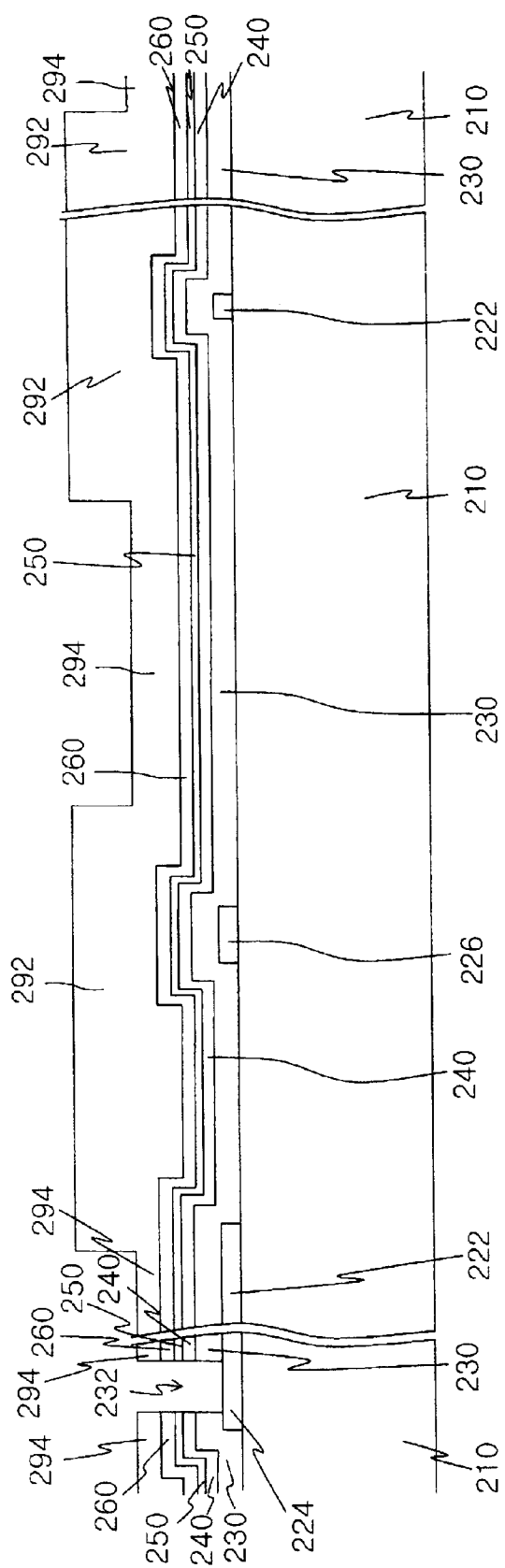
FIG. 14 is a cross sectional view of the TFT array substrate taken along the XIIIb–XIIIb' line of FIG. 13A illustrating the subsequent processing step to that illustrated in FIG. 13B.

Thereafter, as shown in FIG. 14, the conductive layer 260, the ohmic contact layer 250 and the semiconductor layer 240 over the gate pad 224 are removed while using the first and second portions 292 and 294 of the photoresist film 290 as an etching stopper.

Figure 15:
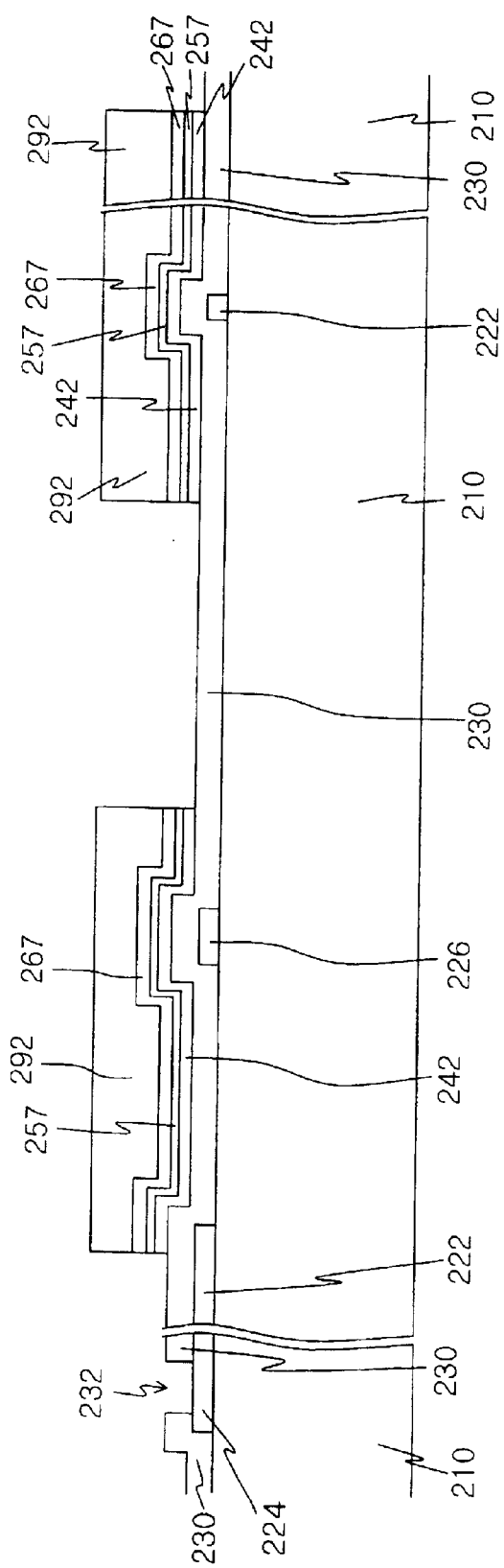
FIG. 15 is a cross sectional view of the TFT array substrate taken along the XIIIb–XIIIb' line of FIG. 13A illustrating the subsequent processing step to that illustrated in FIG. 14.

As shown in FIG. 15, the second portion 294 of the photoresist film 290 is removed through ashing while partially etching the first portion 292 of the photoresist film 290 such that the thickness thereof becomes thinner. Then, the exposed conductive layer 260, and the underlying ohmic contact layer 250 and semiconductor layer 240 are etched to thereby form a conductive pattern 267, an ohmic contact patterns 257 and a semiconductor pattern 242.

Thereafter, the remaining first portion 292 of the photoresist film 290 is removed.

As shown in FIGS. 11 and 12, the conductive pattern 267 and the underlying ohmic contact pattern 257 at the channel area are etched to thereby complete data lines 262, data pads 264, source and drain electrodes 265 and 266, and ohmic contact patterns 255 and 256. Then, pixel electrodes 282, and subsidiary gate and data pads 284 and 286 are formed on the substrate 210. A protective layer 270 is then deposited onto the substrate 210, and patterned to thereby form contact holes 272 and 273 exposing the subsidiary gate and data pads 284 and 286, respectively.

Figure 16:
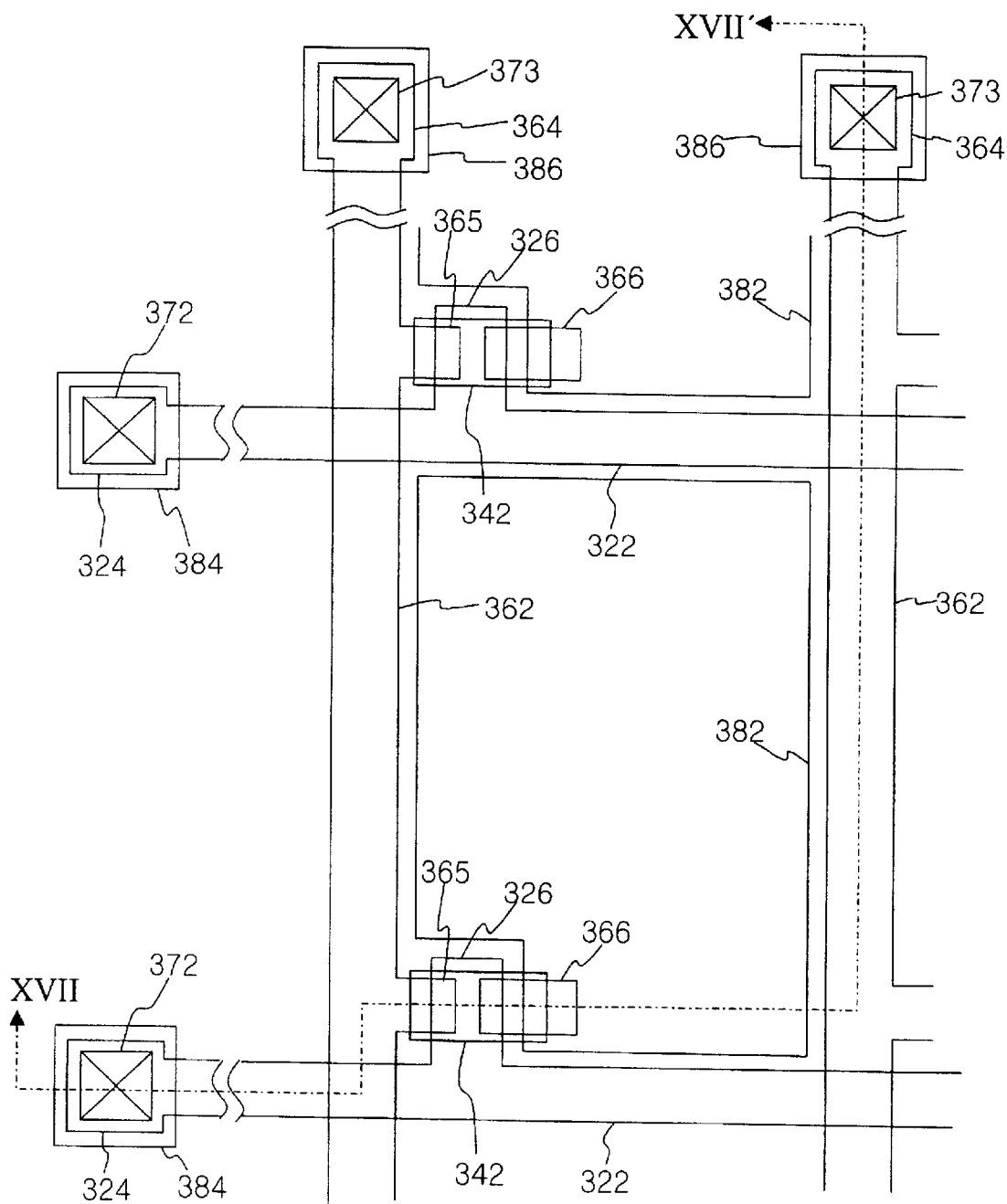
FIG. 16 is a plan view of a TFT array substrate for a liquid crystal display according to a third preferred embodiment of the present invention.
Figure 17:
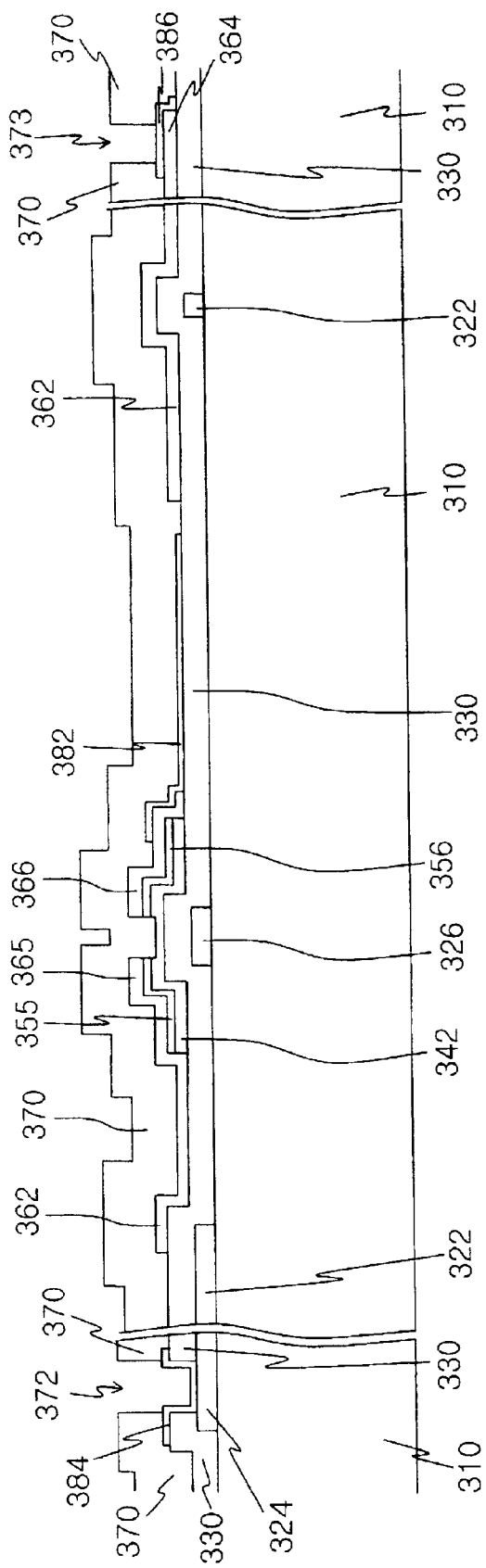
FIG. 17 is a cross sectional view of the TFT array substrate taken along the XVII–XVII' line of FIG. 16.

FIG. 16 is a plan view of a TFT array substrate for a liquid crystal display according to a third preferred embodiment of the present invention, and FIG. 17 is a cross sectional view of the TFT array substrate taken along the XVII–XVII' line of FIG. 16. In this preferred embodiment, other components and structures of the TFT array substrate are the same as those related to the first preferred embodiment except that pixel electrodes 382 and subsidiary gate and data pads 384 and 386 are formed under a protective layer 370, and a data line assembly has a shape different from that of ohmic contact patterns 355 and 356. Furthermore, the storage capacitor electrode 128, the storage capacitor conductive pattern 168, the semiconductor pattern 148 and the ohmic contact pattern 158 are omitted.

As is in the first preferred embodiment, a gate line assembly is first formed on an insulating substrate 310. The gate line assembly includes gate lines 322, gate pads 324, and gate electrodes 326.

Figure 18A:
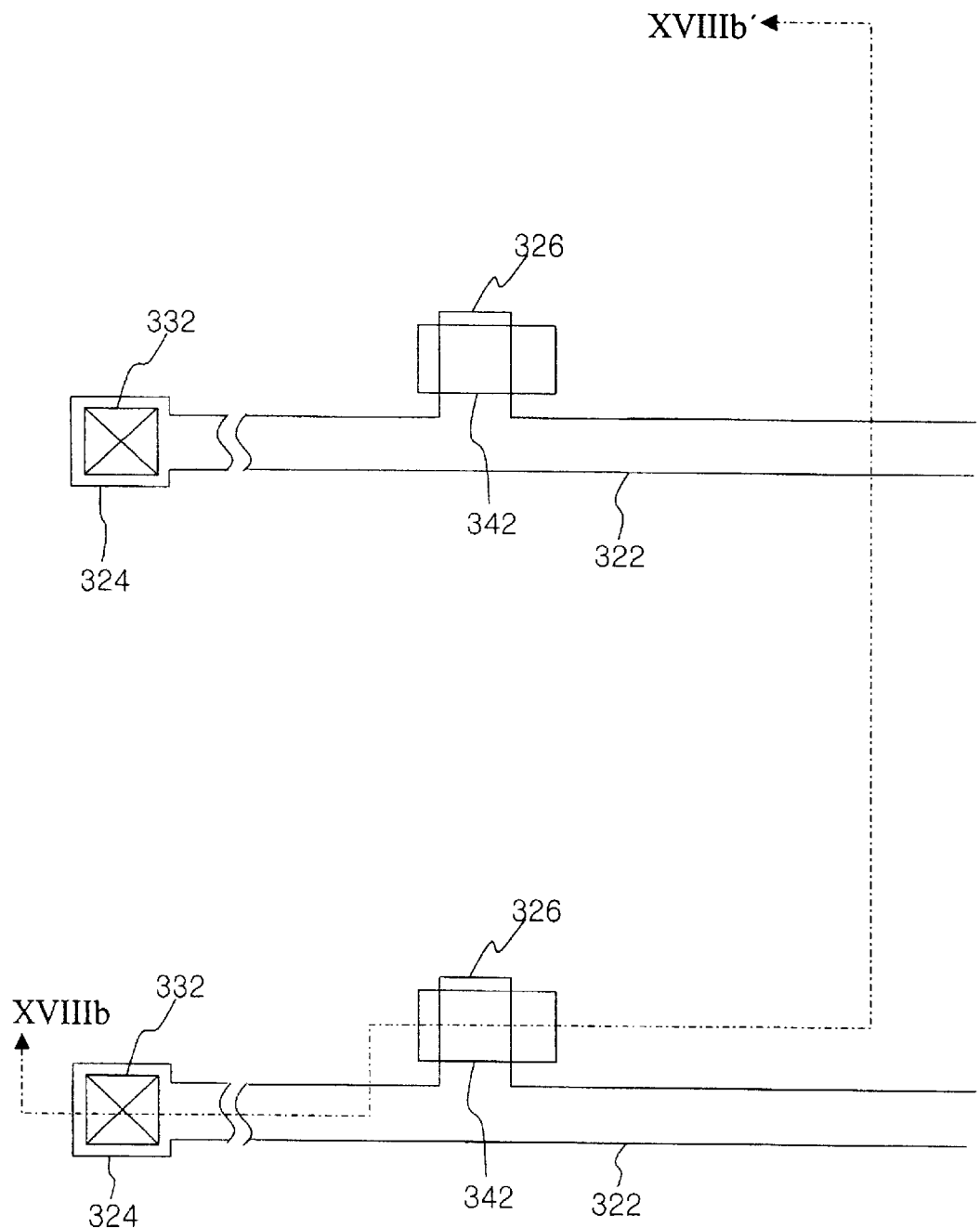
FIG. 18A is a plan view of the TFT array substrate shown in FIG. 16 illustrating the first step of processing the same.
Figure 18B:
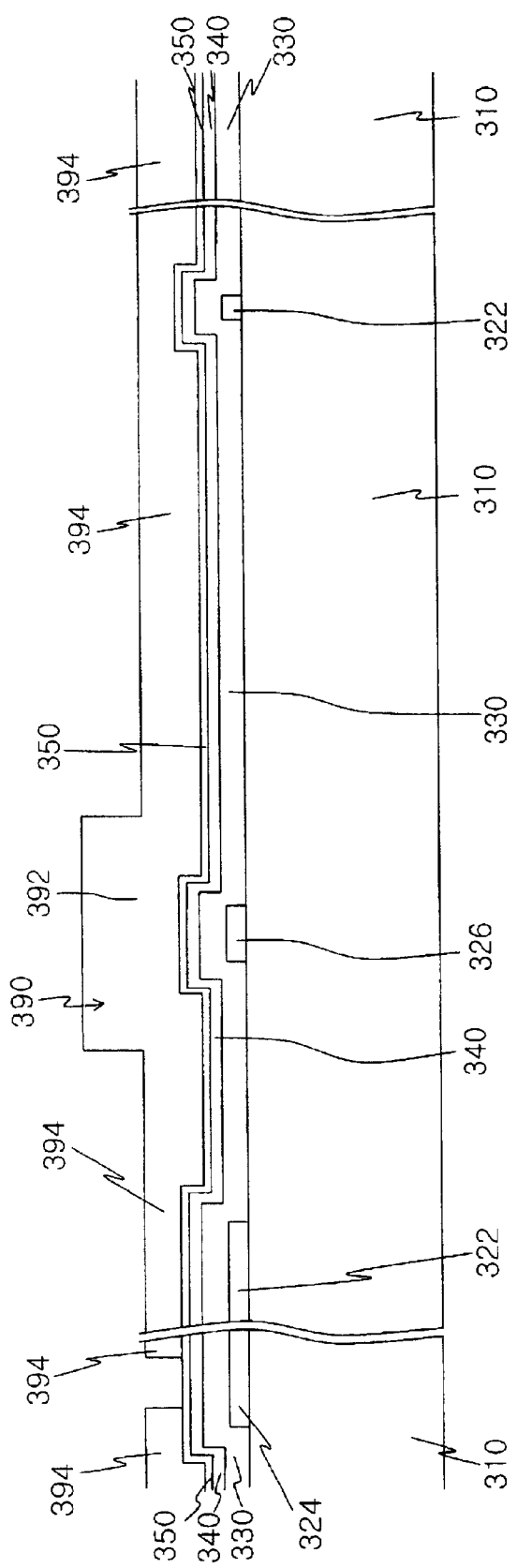
FIG. 18B is a cross sectional view of the TFT array substrate taken along the XVIIIb–XVIIIb' line of FIG. 18A.

Thereafter, as shown in FIGS. 18A and 18B, a gate insulating layer 330, a semiconductor layer 340, and an ohmic contact layer 350 are sequentially deposited onto the substrate 310 with the gate line assembly. A photoresist film 390 is deposited onto the ohmic contact layer 350, and goes through the double light exposing process rig such that it has first and second portions 392 and 394. The first portion 392 of the photoresist film 390 with a predetermined thickness is to form a semiconductor pattern 342 and ohmic contact patterns 355 and 356. The second portion 394 of the photoresist film 390 is thinner than the first portion 392. And the remaining portion of the photoresist film 390 with no thickness is to form a contact hole 332 over the gate pad 324.

Figure 19:
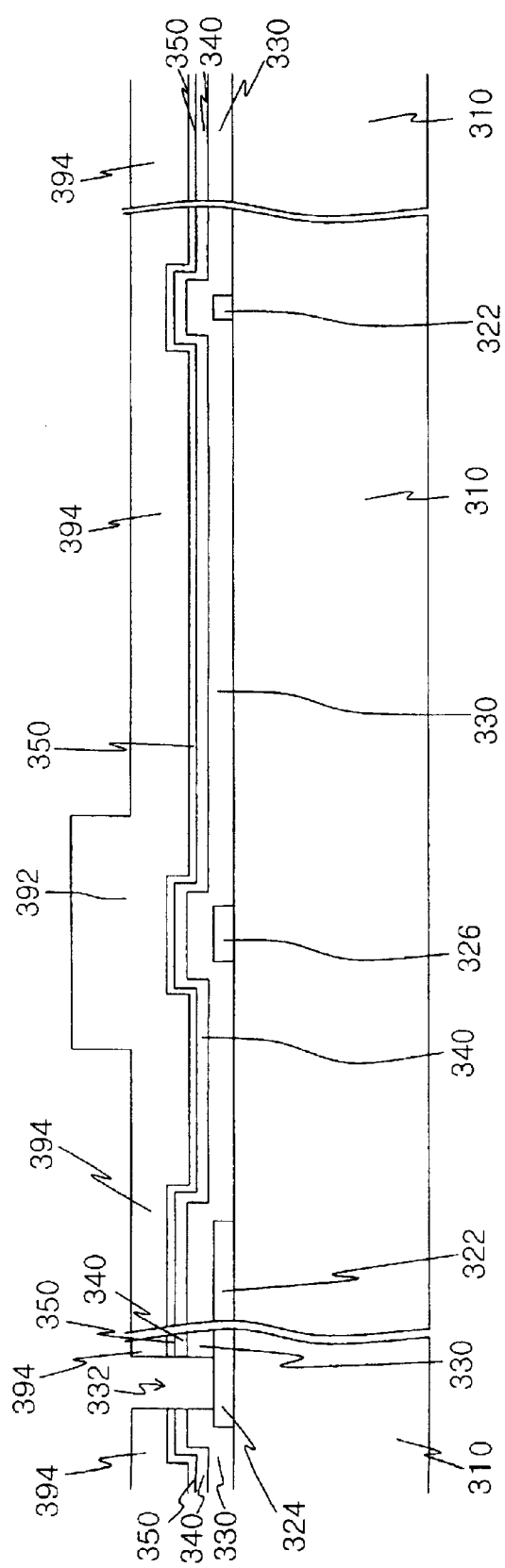
FIG. 19 is a cross sectional view of the TFT array substrate taken along the XVIIIb–XVIIIb' line of FIG. 18A illustrating the subsequent processing step to that illustrated in FIG. 18B.

Thereafter, as shown in FIG. 19, the ohmic contact layer 350, the semiconductor layer 340 and the gate insulating layer 330 over the gate pad 324 are etched.

Figure 20:
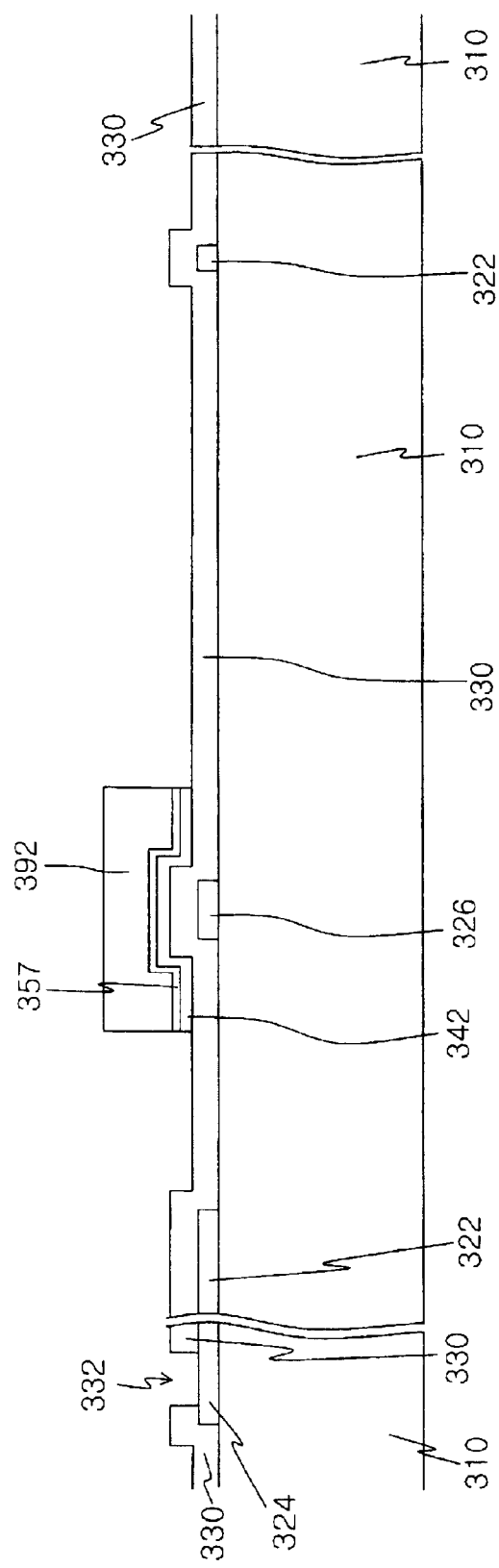
FIG. 20 is a cross sectional view of the TFT array substrate taken along the XVIIIb–XVIIIb' line of FIG. 18A illustrating the subsequent processing step to that illustrated in FIG. 19.

As shown in FIG. 20, the second portion 394 of the photoresist film 390 is removed through ashing while partially etching the first portion 392 of the photoresist film 390 such that the thickness thereof becomes thinner. Then, the exposed ohmic contact layer 350 and the underlying semiconductor layer 340 are etched to thereby form an ohmic contact pattern 357 and a semiconductor pattern 342.

Thereafter, the remaining first portion 392 of the photoresist film 390 is removed.

As shown in FIGS. 16 and 17, data lines 362, data pads 364, and source and drain electrodes 365 and 366 are formed on the substrate 310, and the ohmic contact pattern 357 is etched to thereby complete ohmic contact patterns 355 and 356. Pixel electrodes 382, and subsidiary gate and data pads 384 and 386 are formed on the substrate 310. A protective layer 370 is deposited onto the substrate 310, and patterned to thereby form contact holes 372 and 373 exposing the subsidiary gate and data pads 384 and 386, respectively.

Figure 21:
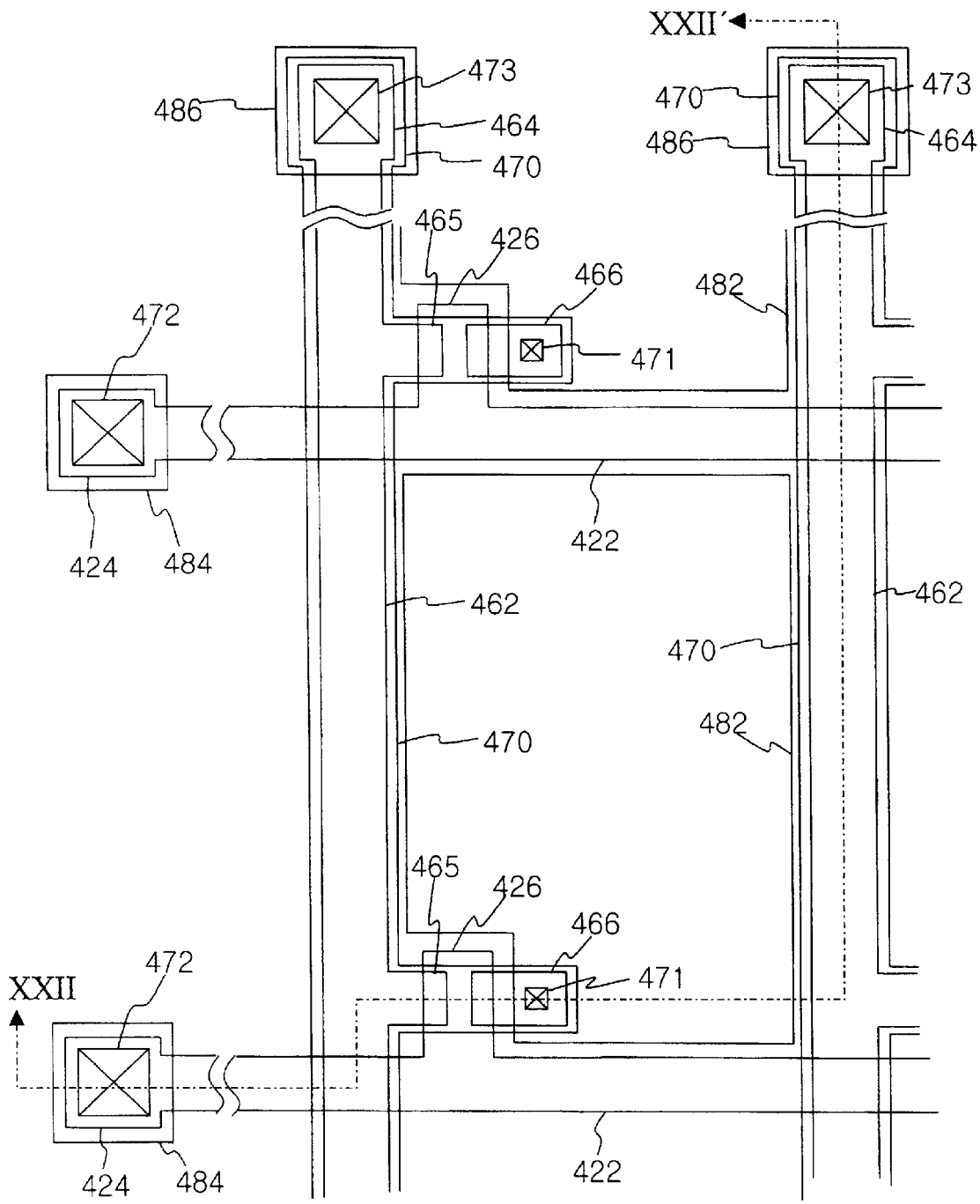
FIG. 21 is a plan view of a TFT array substrate for a liquid crystal display according to a fourth preferred embodiment of the present invention.
Figure 22:
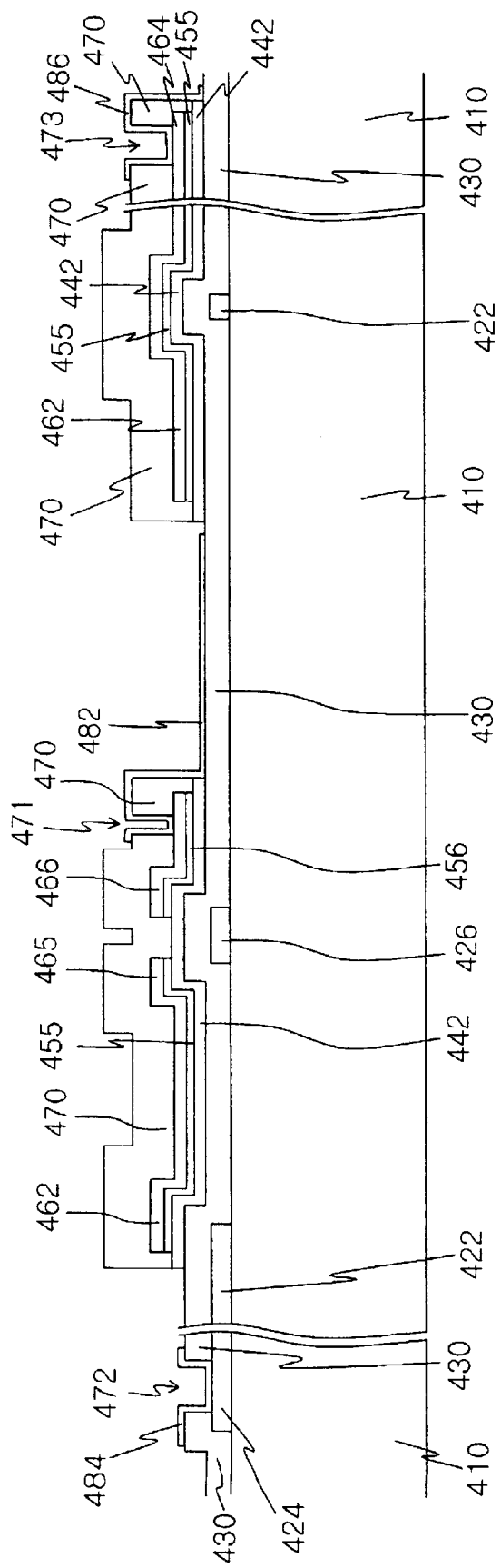
FIG. 22 is a cross sectional view of the TFT array substrate taken along the XXII–XXII' line of FIG. 21.

FIG. 21 is a plan view of a TFT array substrate of a liquid crystal display according to a fourth preferred embodiment of the present invention, and FIG. 22 is a cross sectional view of the TFT array substrate taken along the XXII–XXII' line of FIG. 21. In this preferred embodiment, other components and structures of the TFT array substrate are the same as those related to the first preferred embodiment except that a protective layer 470 has a similar shape to that of a data line assembly. Furthermore, the storage capacitor electrode 128, the storage capacitor conductive pattern 168, the semiconductor pattern 148 and the ohmic contact pattern 158 are omitted.

As is in the first preferred embodiment, a gate line assembly is first formed on an insulating substrate 410. The gate line assembly includes gate lines 422, gate pads 424, and gate electrodes 426.

Figure 23A:
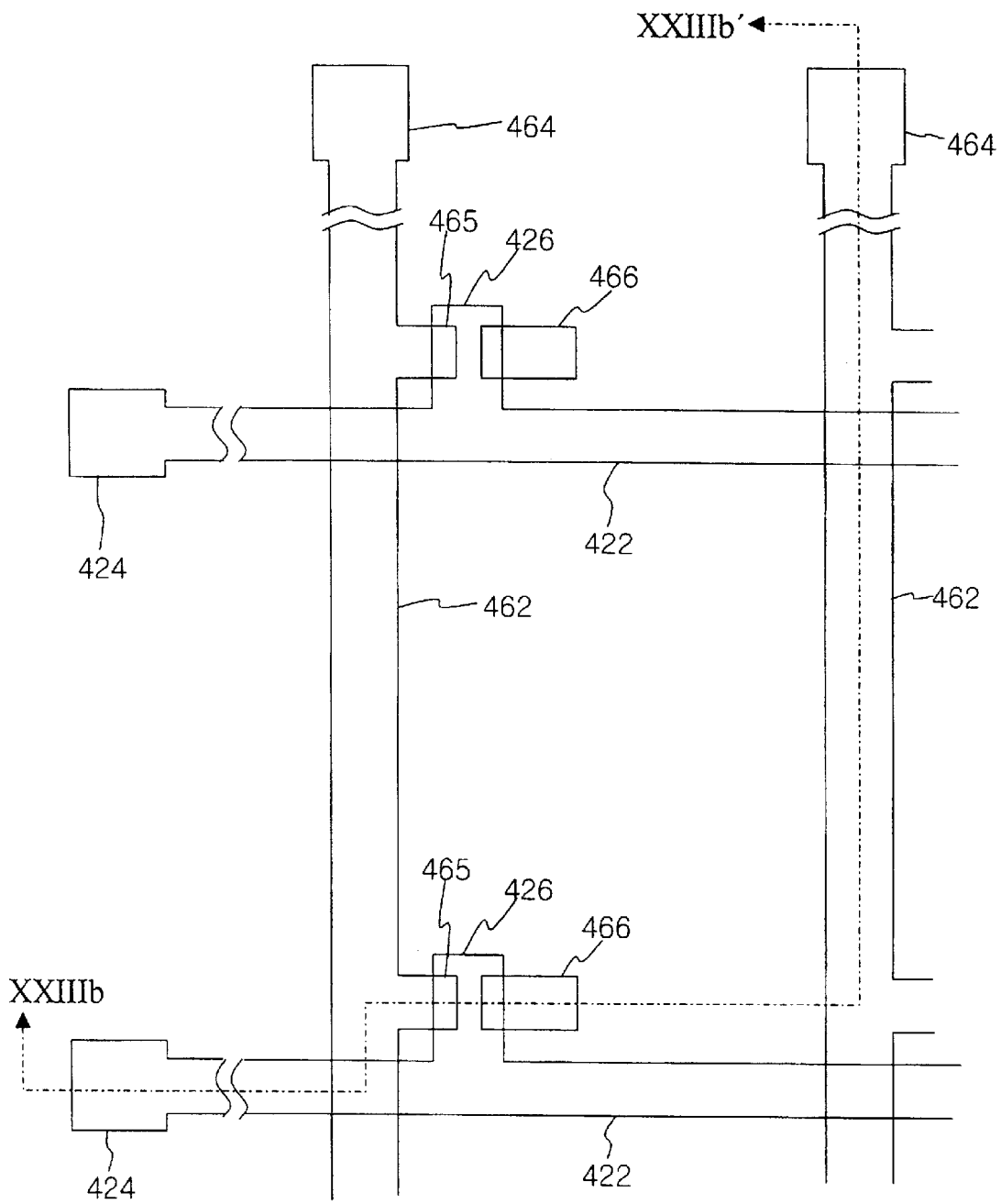
FIG. 23A is a plan view of the TFT array substrate shown in FIG. 21 illustrating the first step of processing the same.
Figure 23B:
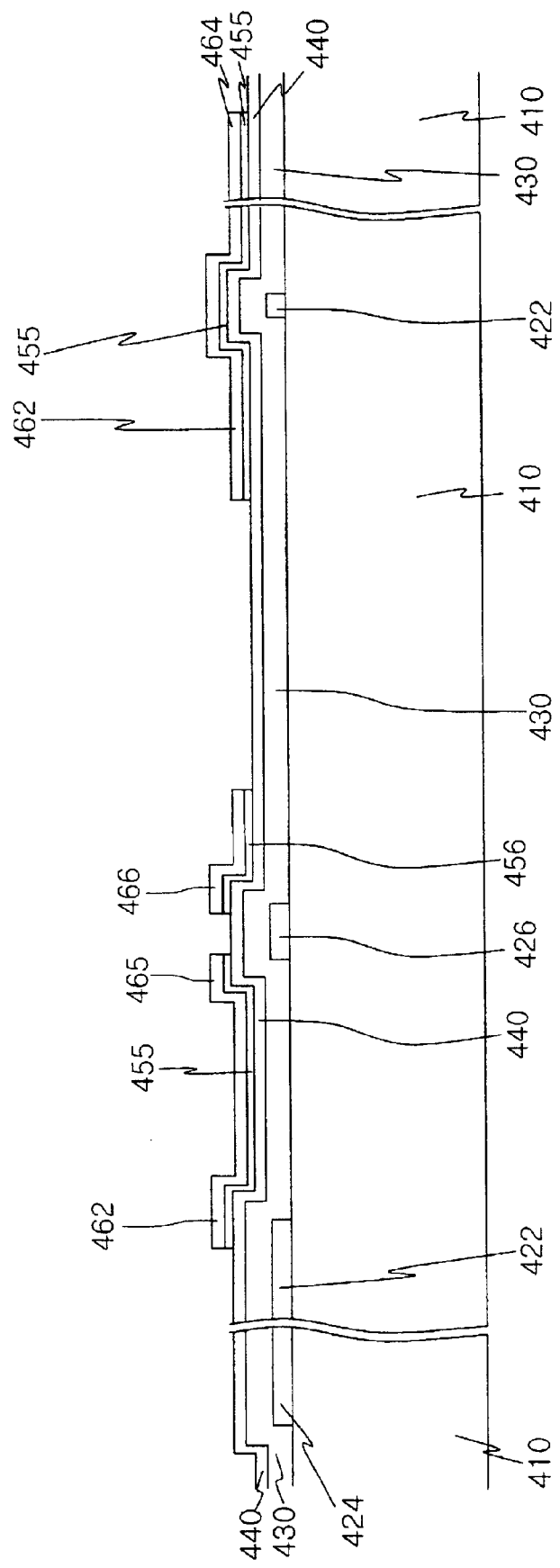
FIG. 23B is a cross sectional view of the TFT array substrate taken along the XXIIIb–XXIIIb' line of FIG. 23A.

Thereafter, as shown in FIGS. 23A and 23B, a gate insulating layer 430, a semiconductor layer 440, an ohmic contact layer 450, and a conductive layer 460 are sequentially deposited onto the substrate 410 with the gate line assembly. The conductive layer 460 and the underlying ohmic contact layer 450 are etched to thereby form a data line assembly, and ohmic contact patterns 455 and 456. The data line assembly includes data lines 462, data pads 464, and source and drain electrodes 465 and 466.

Figure 24A:
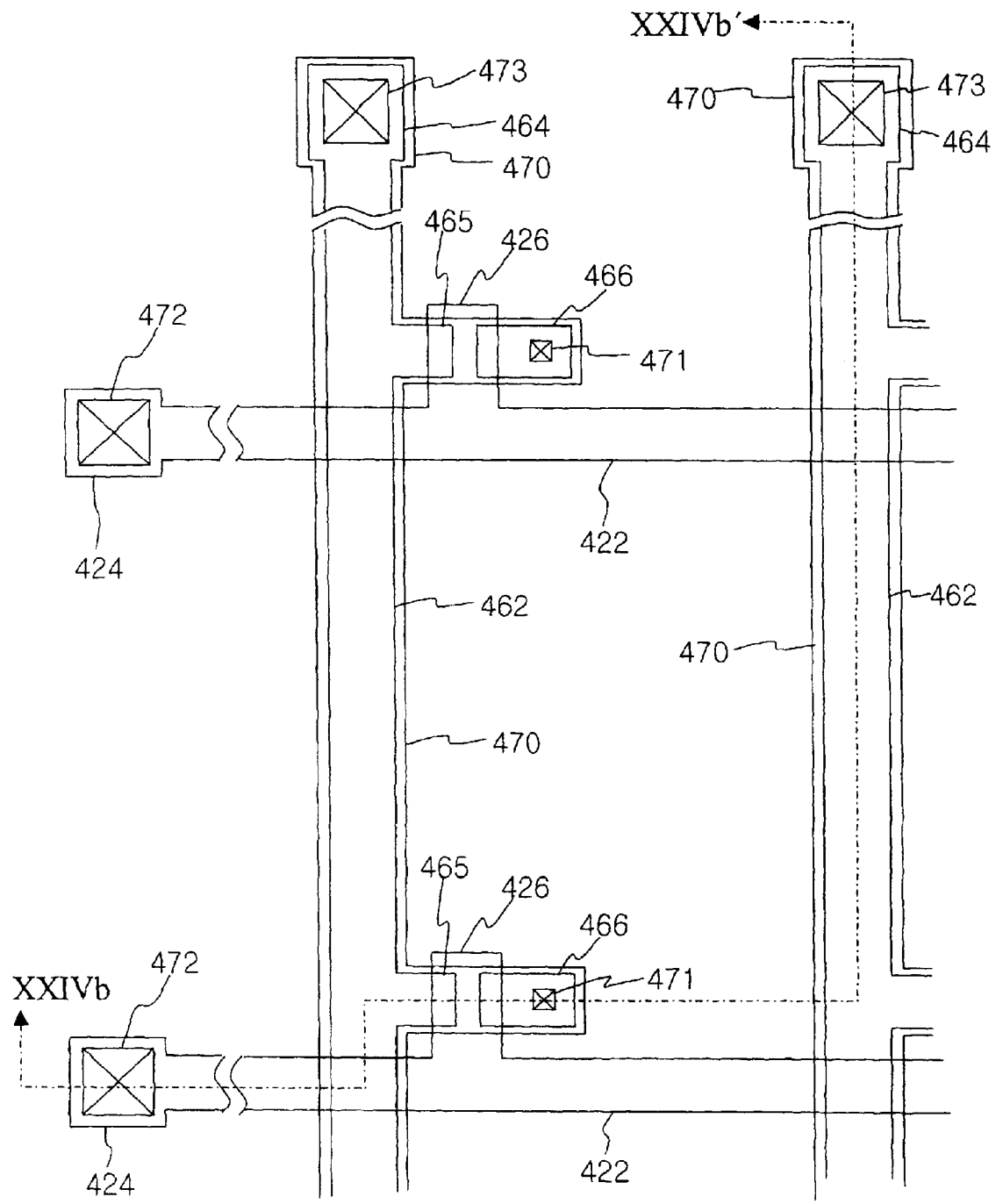
FIG. 24A is a plan view of the TFT array substrate shown in FIG. 21 illustrating the subsequent processing step to that illustrated in FIG. 23B.
Figure 24B:
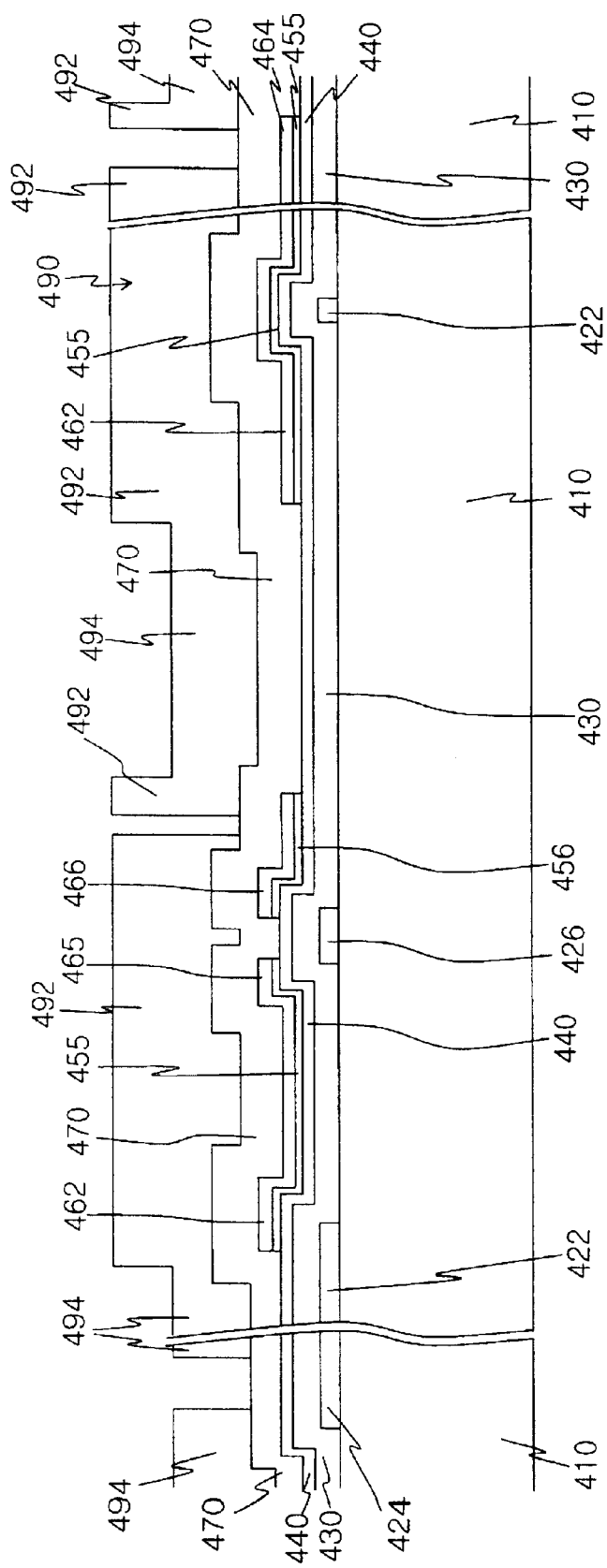
FIG. 24B is a cross sectional view of the TFT array substrate taken along the XXIVb–XXIVb' line of FIG. 24A.

Thereafter, as shown in FIGS. 24A and 24B, a protective layer 470 is deposited onto the substrate 410 with the data line assembly. A photoresist film 490 is deposited onto the protective layer 470, and suffers through the double light exposing process such that it has first and second portions 492 and 494. The first portion 492 of the photoresist film 490 with a predetermined thickness is to form the data line assembly. The second portion 494 of the photoresist film 490 is thinner than the first portion 492. And the remaining portion of the photoresist film 490 with no thickness is to form first to third contact holes 471 to 473 over the drain electrode 466, the gate pad 424 and the data pad 464.

Thereafter, as shown in FIG. 25, the exposed protective layer 470 over the drain electrode 466 and the data pad 464 are etched to thereby form the first and third contact holes 471 and 473, and the exposed protective layer 470 and the underlying semiconductor layer 440 and gate insulating layer 430 over the gate pad 422 are etched to thereby form the second contact hole 472.

Figure 26:
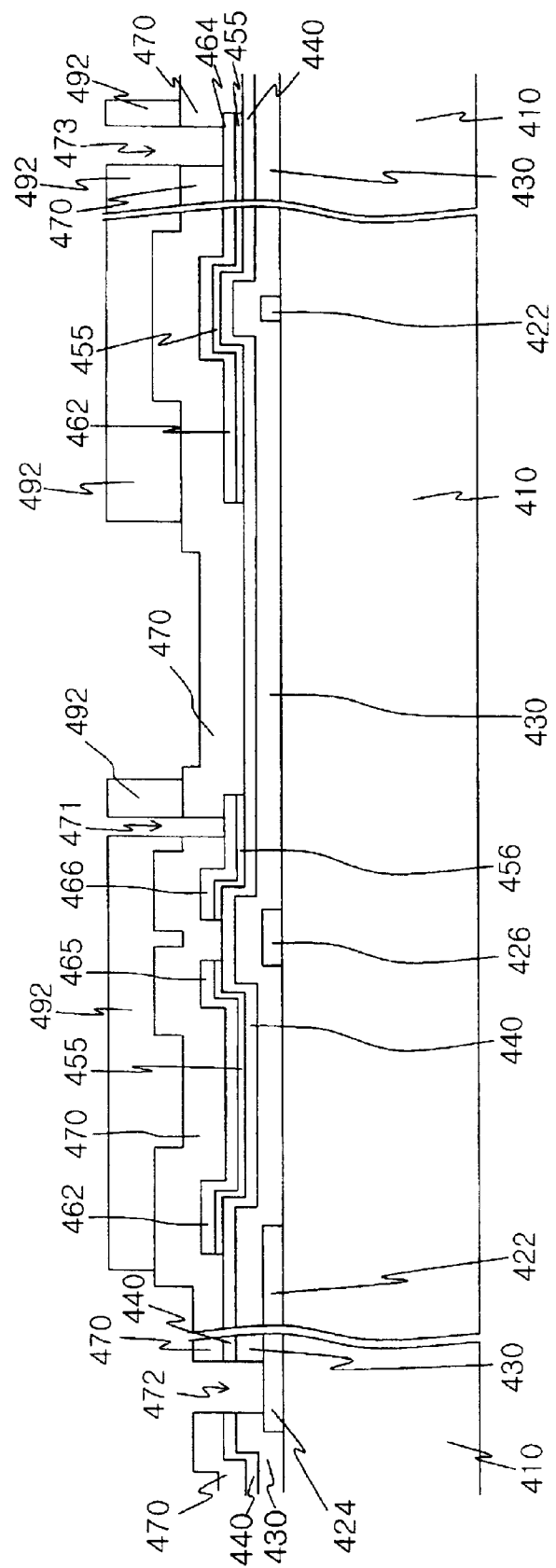
FIG. 26 is a cross sectional view of the TFT array substrate taken along the XXIVb–XXIVb' line of FIG. 24A illustrating the subsequent processing step to that illustrated in FIG. 25.

As shown in FIG. 26, the second portion 494 of the photoresist film 490 is removed through ashing while partially etching the first portion 492 of the photoresist film 490 such that the thickness thereof becomes thinner.

Figure 27:
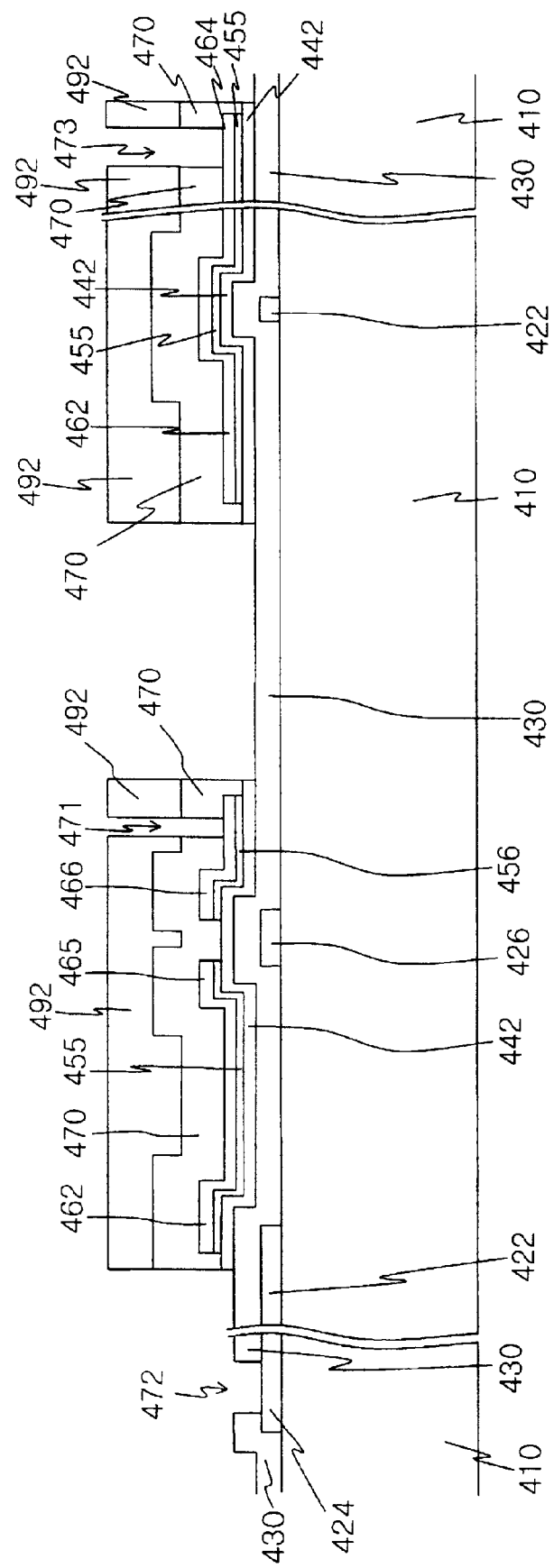
FIG. 27 is a cross sectional view of the TFT array substrate taken along the XXIVb–XXIVb' line of FIG. 24A illustrating the subsequent processing step to that illustrated in FIG. 26.

As shown in FIG. 27, the exposed protective layer 470 and the underlying semiconductor layer 440 are etched.

Thereafter, the remaining first portion 492 of the photoresist film 490 is removed.

As shown in FIGS. 21 and 22, pixel electrodes 482, and subsidiary gate and data pads 484 and 486 are formed on the substrate 410.

Figure 28:
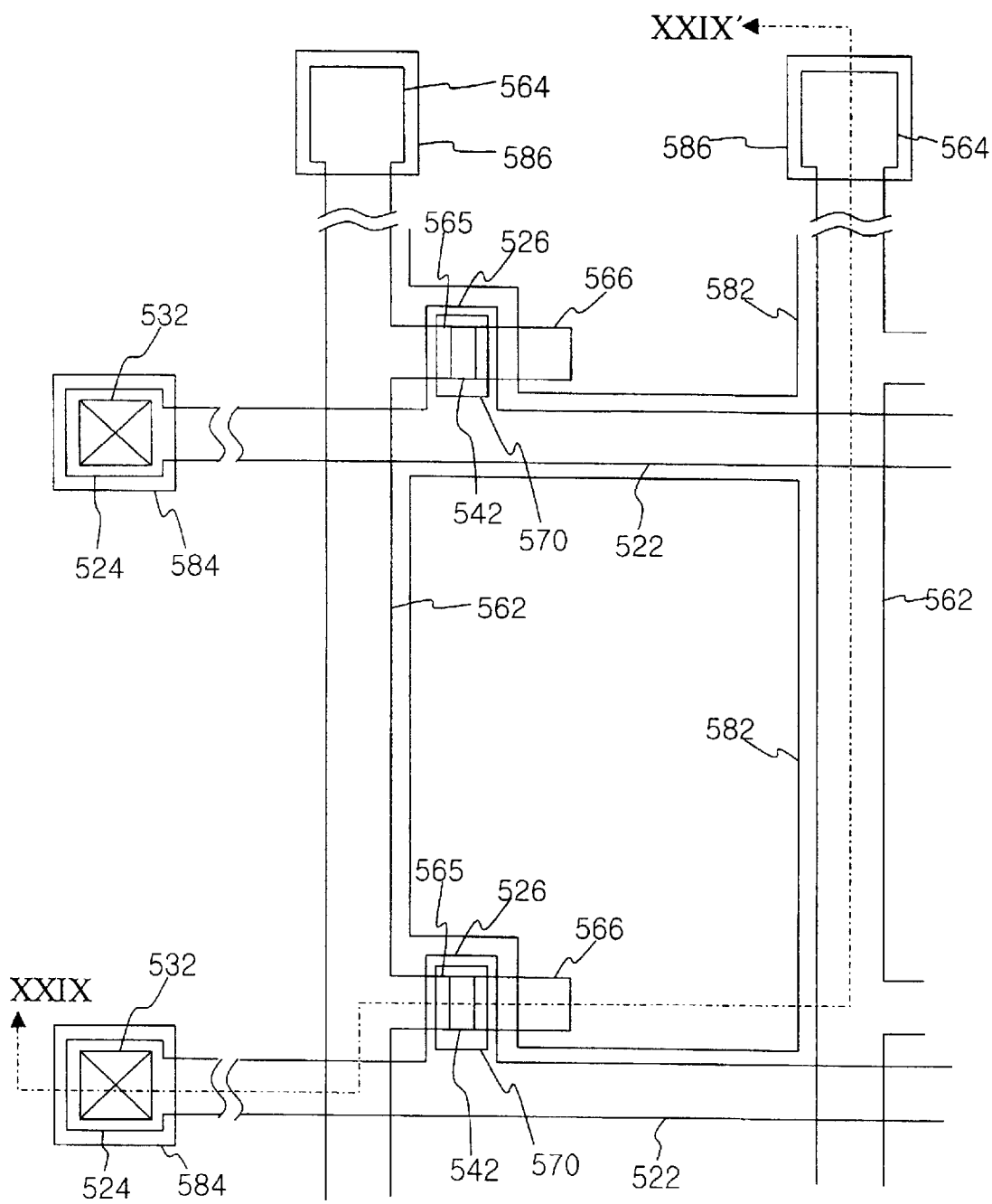
FIG. 28 is a plan view of a TFT array substrate for a liquid crystal display according to a fifth preferred embodiment of the present invention.
Figure 29:
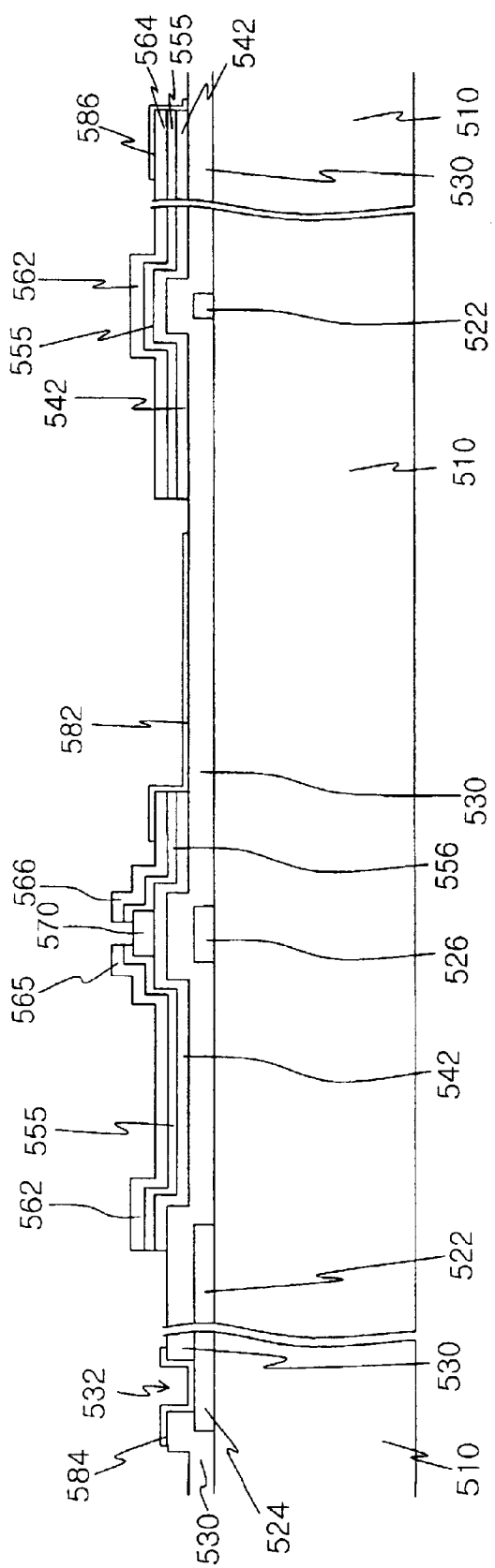
FIG. 29 is a cross sectional view of the TFT array substrate taken along the XXIX–XXIX' line of FIG. 28.

FIG. 28 is a plan view of a TFT array substrate of a liquid crystal display according to a fifth preferred embodiment of the present invention, and FIG. 29 is a cross sectional view of the TFT array substrate taken along the XXIX–XXIX' line of FIG. 28. In this preferred embodiment, other components and structures of the TFT array substrate are the same as those related to the first preferred embodiment except that a protective layer 570 is formed only over a gate electrode 526, and hence, contact holes exposing a drain electrode 566 and a data pad 564 are not formed. Furthermore, the storage capacitor electrode 128, the storage capacitor conductive pattern 168, the semiconductor pattern 148 and the ohmic contact pattern 158 are omitted.

As is in the first preferred embodiment, a gate line assembly is first formed on an insulating substrate 510. The gate line assembly includes gate lines 522, gate pads 524, and gate electrodes 526.

Figure 30A:
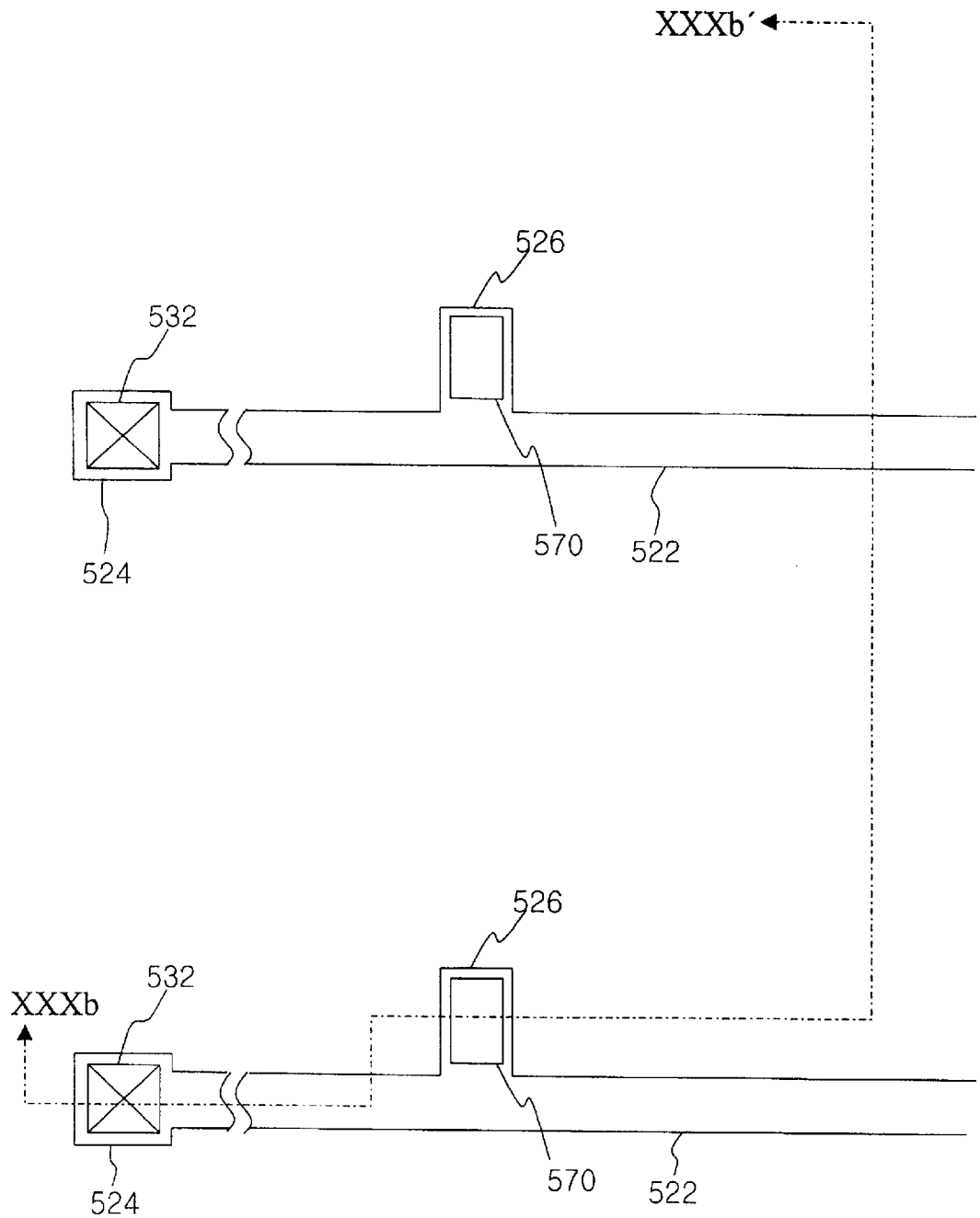
FIG. 30A is a plan view of the TFT array substrate shown in FIG. 28 illustrating the first step of processing the same.
Figure 30B:
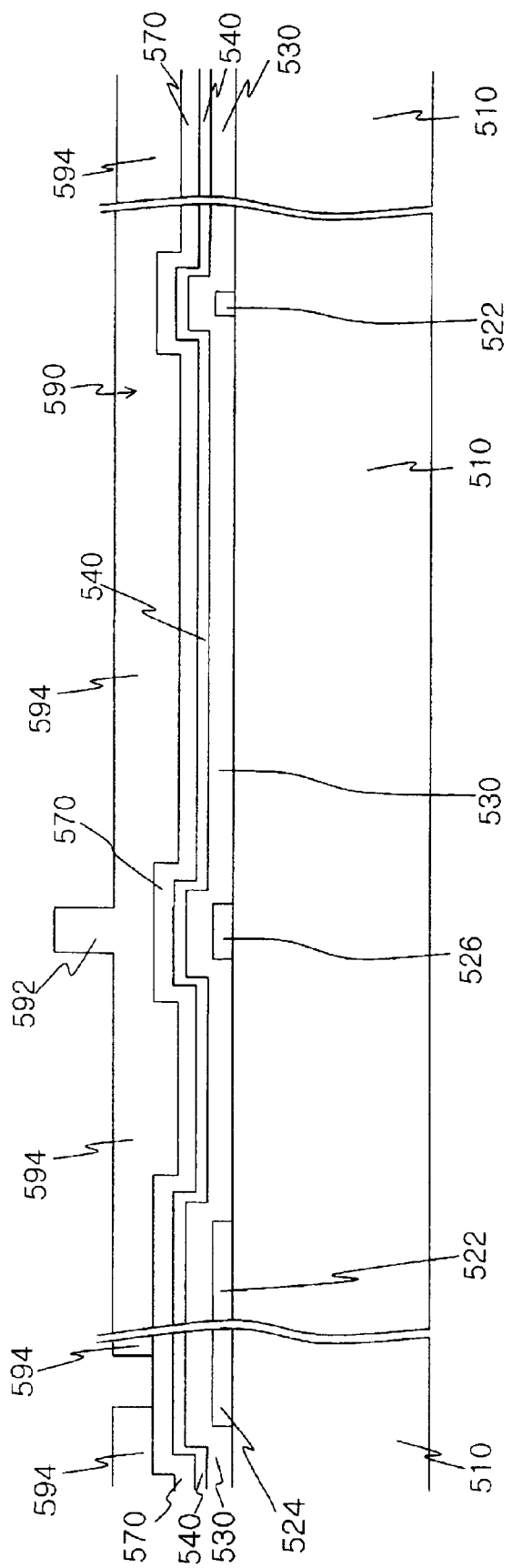
FIG. 30B is a cross sectional view of the TFT array substrate taken along the XXXb–XXXb' line of FIG. 30A.

Thereafter, as shown in FIGS. 30A and 30B, a gate insulating layer 530, a semiconductor layer 540, and a protective layer 570 are sequentially deposited onto the substrate 510 with the gate line assembly. A photoresist film 590 is deposited onto the protective layer 570, and goes through the double light exposing process such that it has first and second portions 592 and 594. The first portion 592 of the photoresist film 590 is placed over the gate electrode 526 with a predetermined thickness. The second portion 594 of the photoresist film 590 is thinner than the first portion 592. And the remaining portion of the photoresist film 590 with no thickness is to form a contact hole 532 over the gate pad 524.

Figure 31:
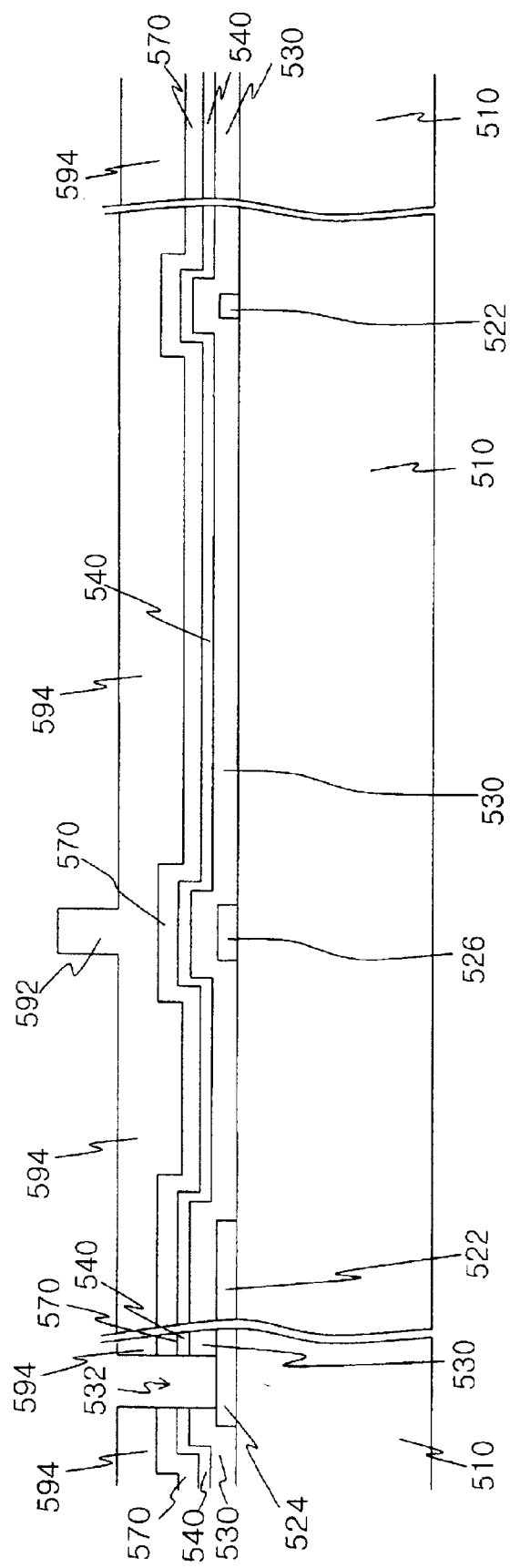
FIG. 31 is a cross sectional view of the TFT array substrate taken along the XXXb–XXXb' line of FIG. 30A illustrating the subsequent processing step to that illustrated in FIG. 30B.

Thereafter, as shown in FIG. 31, the exposed protective layer 570, and the underlying semiconductor layer 540 and gate insulating layer 530 over the gate pad 524 are etched to thereby form the contact hole 532.

Figure 32:
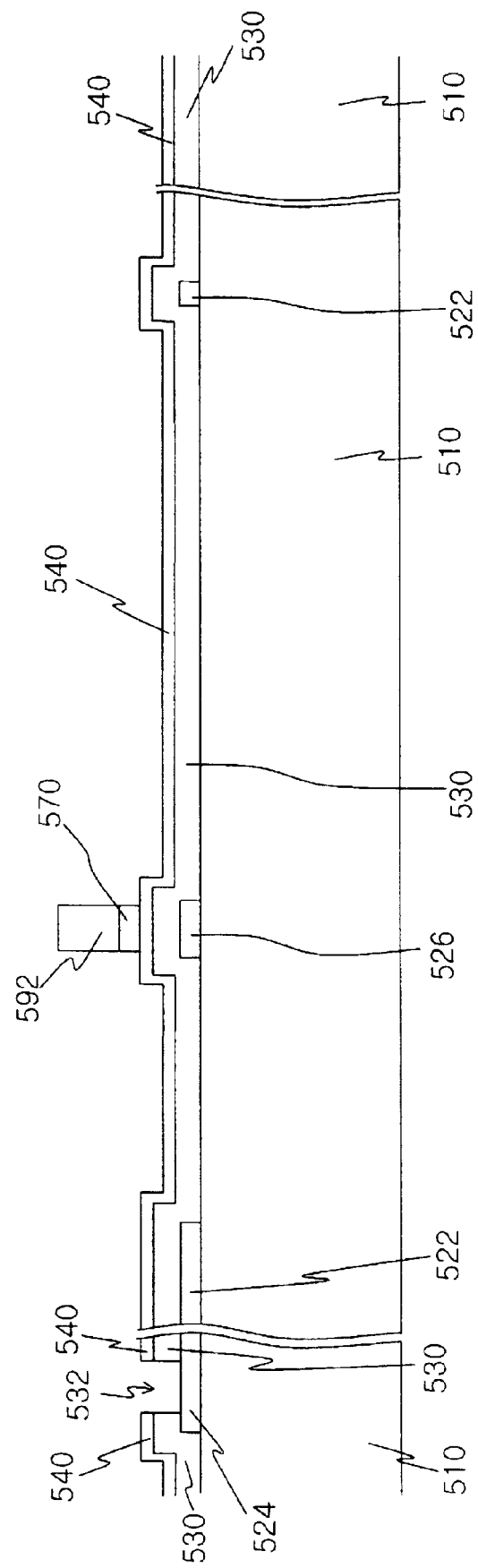
FIG. 32 is a cross sectional view of the TFT array substrate taken along the XXXb–XXXb' line of FIG. 30A illustrating the subsequent processing step to that illustrated in FIG. 31.

As shown in FIG. 32, the second portion 594 of the photoresist film 590 is removed through ashing while partially etching the first portion 592 of the photoresist film 590 such that the thickness thereof becomes thinner. Then, the protective layer 570 is etched such that it is left only over the gate electrode 526.

Thereafter, the remaining first portion 592 of the photoresist film 590 is removed.

As shown in FIGS. 28 and 29, an ohmic contact layer and a conductive layer are deposited onto the substrate 510, and patterned to thereby form a semiconductor pattern 542, ohmic contact patterns 555 and 556, data lines 562, data pads 564, and source and drain electrodes 565 and 566. Then, pixel electrodes 582, and subsidiary gate and data pads 584 and 586 are formed on the substrate 510.

In the meantime, the TFT array substrate may further include a common electrode arranged parallel to the pixel electrodes to thereby control orientation directions of the liquid crystal molecules aligned over the substrate parallel thereto.

As described above, for the purpose of etching multiple layers all at once, a double light exposing process is used to form a photoresist film differing in thickness. On the basis of such a photoresist film, uniform patterns can be obtained over the entire area of the substrate with simplified processing steps.

The inventive photolithography system for performing such a double light exposing process has two light exposing units so that the light exposing can be effectively made.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of fabricating a thin film transistor array substrate for a liquid crystal display, comprising the steps of:
    forming a gate line assembly on an insulating substrate, the gate line assembly comprising gate lines, and gate electrodes connected to the gate lines;
    sequentially depositing a gate insulating layer, a semiconductor layer, an ohmic contact layer and a conductive layer onto the substrate with the gate line assembly;
    patterning the conductive layer, the ohmic contact layer, and the semiconductor layer to thereby form a data line assembly, an ohmic contact pattern and a semiconductor pattern, the data line assembly comprising data lines, source electrodes connected to the data lines, and drain electrodes separated from the data lines and the source electrodes;
    forming a protective layer such that the protective layer covers the data line assembly, the protective layer having a contact hole exposing the drain electrode; and
    forming pixel electrodes such that each pixel electrode is connected to the drain electrode via the contact hole;

wherein the step of forming the data line assembly, the ohmic contact pattern and the semiconductor pattern is performed through photolithography using one photoresist pattern, and
wherein the photoresist pattern is made through first exposing a photoresist film to light to form the data line assembly, and secondly exposing the photoresist film to light to form a channel between the source and drain electrodes, the photoresist pattern comprising a first portion placed between the source electrode and the drain electrode with a predetermined thickness, a second portion thicker than the first portion, and a third portion having no thickness.

2. The method of claim 1, wherein the first exposure and the second exposure are performed respectively using a separate light exposing unit.

3. The method of claim 1, wherein light intensity of the second exposure is lower than light intensity of the first exposure.

4. The method of claim 3, wherein the time period for the second exposure is shorter than the time period for the first exposure.

5. The method of claim 1, wherein the time period for the second exposure is shorter than the time period for the first exposure.

6. A method of fabricating a thin film transistor array substrate for a liquid crystal display, comprising the steps of:
    forming a gate line assembly on an insulating substrate, the gate line assembly comprising gate lines, gate electrodes connected to the gate lines, and gate pads connected to the gate lines;
    sequentially depositing a gate insulating layer, a semiconductor layer, an ohmic contact layer and a conductive layer onto the substrate with the gate line assembly;
    patterning the conductive layer, the ohmic contact layer, the semiconductor layer and the gate insulating layer to thereby form a first contact hole exposing the gate pad, a conductive pattern, an ohmic contact pattern, and a semiconductor pattern;
    patterning the conductive pattern and the ohmic contact pattern to thereby complete a data line assembly and ohmic contact patterns, the data line assembly comprising data lines, source electrodes connected to the data lines, drain electrodes separated from the data lines and the source electrodes, and data pads connected to one-sided end portions of the data lines;
    forming pixel electrodes such that each pixel electrode is connected to the drain electrode; and
    forming a protective layer such that the protective layer covers the data line assembly and the pixel electrodes, the protective layer having second and third contact holes exposing the gate and data pads, respectively, wherein the step of forming the first contact hole, the ohmic contact pattern and the semiconductor pattern is performed through photolithography based on a photoresist pattern, and
wherein the photoresist pattern is made through first exposing a photoresist film to light to form the conductive pattern, and secondly exposing the photoresist film to light to form the first contact hole, the photoresist pattern comprising a first portion placed over the conductive pattern with a predetermined thickness, a second portion placed over the first contact hole with no thickness, and a third portion thinner than the first portion.

7. The method of claim 6, wherein the first light exposure and the second light exposure are performed respectively using a separate light exposing unit.

8. The method of claim 6, wherein light intensity of at the first exposure is lower than light intensity of the second exposure.

9. The method of claim 8, wherein the time period for the first exposure is shorter than the time period for the second exposure.

10. The method of claim 6, wherein the time period for the first exposure is shorter than the time period for the second exposure.

11. A method of fabricating a thin film transistor array substrate for a liquid crystal display, comprising the steps of:

forming a gate line assembly on an insulating substrate, the gate line assembly comprising gate lines, gate electrodes connected to the gate lines, and gate pads connected to the gate lines;

sequentially depositing a gate insulating layer, a semiconductor layer, and an ohmic contact layer onto the substrate with the gate line assembly;

patterning the ohmic contact layer, the semiconductor layer and the gate insulating layer to thereby form a first contact hole exposing the gate pad, an ohmic contact pattern, and a semiconductor pattern;

forming a data line assembly on the ohmic contact pattern, the data line assembly comprising data lines, source electrodes connected to the data lines, drain electrodes separated from the data lines and the source electrodes, and data pads connected to one-sided end portions of the data lines;

completing the ohmic contact pattern;

forming pixel electrodes such that each pixel electrode is connected to the drain electrode; and forming a protective layer such that the protective layer covers the data line assembly and the pixel electrodes, the protective layer having second and third contact holes exposing the gate and data pads, respectively, and wherein the step of forming the first contact hole, the ohmic contact pattern and the semiconductor pattern is performed through photolithography using one photoresist pattern; and wherein the photoresist pattern is made through first exposing a photoresist film to light to form the ohmic contact pattern, and secondly exposing the photoresist film to light to form the first contact hole, the photoresist pattern comprising a first portion placed over the ohmic contact pattern with a predetermined thickness, a second portion placed over the first contact hole with no thickness, and a third portion thinner than the first portion.

12. The method of claim 11, wherein the first exposure and the second exposure are performed respectively by a separate light exposing unit.

13. The method of claim 11, wherein light intensity of the first exposure is lower than light intensity of the second exposure.

14. The method of claim 13, wherein the time period for the first exposure is shorter than the time period for the second exposure.

15. The method of claim 11, wherein the time period for the first exposure is shorter than the time period for the second exposure.

16. A method of fabricating a thin film transistor array substrate for a liquid crystal display, comprising the steps of:

forming a gate line assembly on an insulating substrate, the gate line assembly comprising gate lines, gate electrodes connected to the gate lines, and gate pads connected to the gate lines;

depositing a first insulating layer onto the gate line assembly;

depositing a semiconductor layer onto the first insulating layer;

forming an ohmic contact pattern on the semiconductor layer;

forming a data line assembly on the ohmic contact pattern, the data line assembly comprising data lines, source electrodes connected to the data lines, drain electrodes separated from the data lines and the source electrodes, and data pads connected to one-sided end portions of the data lines;

forming a second insulating layer such that the second insulating layer covers the data line assembly;

patterning the second insulating layer, the semiconductor layer, and the first insulating layer to thereby form a semiconductor pattern and first to third contact holes exposing the drain electrode, the gate pad and the data pad, respectively; and forming pixel electrodes such that each pixel electrode is connected to the drain electrode via the first contact hole, wherein the step of forming the semiconductor pattern and the first to third contact holes is performed through photolithography using one photoresist pattern, and wherein the photoresist pattern is made through first exposing a photoresist film to light to form the semiconductor pattern, and secondly exposing the photoresist film to light to form the first to third contact holes, the photoresist pattern comprising a first portion placed over the semiconductor pattern with a predetermined thickness, a second portion placed over the first to third contact holes with no thickness, and a third portion thinner than the first portion.

17. The method of claim 16, wherein the first exposure and the second exposure are performed respectively by a separate light exposing unit.

18. The method of claim 16, wherein light intensity of the first exposure is lower than light intensity of the second exposure.

19. The method of claim 18, wherein the time period for the first exposure is shorter than the time period for the second exposure.

20. The method of claim 16, wherein the time period for the first exposure is shorter than the time period for the second light exposing.

21. A method of fabricating a thin film transistor array substrate for a liquid crystal display, comprising the steps of:

forming a gate line assembly on an insulating substrate, the gate line assembly comprising gate lines, gate electrodes connected to the gate lines, and gate pads connected to the gate lines;

depositing a first insulating layer, a semiconductor layer and a second insulating layer onto the gate line assembly;

patterning the second insulating layer, the semiconductor layer and the first insulating layer to thereby form a second insulating pattern over the gate electrode, and a contact hole exposing the gate pad;

forming an ohmic contact pattern on the second insulating pattern;

forming a data line assembly on the ohmic contact pattern, the data line assembly comprising data lines, source electrodes connected to the data lines, drain electrodes separated from the data lines and the source electrodes, and data pads connected to one-sided end portions of the data lines; and forming pixel electrodes such that each pixel electrode is connected to the drain electrode, wherein the step of forming the second insulating pattern and the contact hole is performed through photolithography using one photoresist pattern, and wherein the photoresist pattern is made through first exposing a photoresist film to light to form the second insulating pattern, and secondly exposing the photoresist film to light to form the contact hole, the photoresist pattern comprising a first portion placed over the second insulating pattern with a predetermined thickness, a second portion placed over the contact hole with no thickness, and a third portion thinner than the first portion.

22. The method of claim 21, wherein the first exposure and the second exposure are performed respectively by a separate light exposing unit.

23. The method of claim 21, wherein light intensity of the first exposure is lower than light intensity of the second exposure.

24. The method of claim 23, wherein the time period for the first exposure is shorter then the time period for the second exposure.

25. The method of claim 21, wherein the time period for the first exposure is shorter than the time period for the second exposure.

* * * * *